(12) United States Patent
Renault et al.

(10) Patent No.: US 11,667,516 B2
(45) Date of Patent: Jun. 6, 2023

(54) MEMS DEVICE HAVING UNIFORM CONTACTS

(71) Applicant: Qorvo US, Inc., Greensboro, NC (US)

(72) Inventors: Mickael Renault, San Jose, CA (US); Jacques Marcel Muyango, Rocklin, CA (US); Shibajyoti Ghosh Dastider, Roseville, CA (US)

(73) Assignee: Qorvo US, Inc., Greensboro, NC (US)

( * ) Notice: Subject to any disclaimer, the term of this patent is extended or adjusted under 35 U.S.C. 154(b) by 28 days.

(21) Appl. No.: 16/907,162

(22) Filed: Jun. 19, 2020

(65) Prior Publication Data

US 2020/0407214 A1 Dec. 31, 2020

Related U.S. Application Data

(60) Provisional application No. 62/879,185, filed on Jul. 26, 2019, provisional application No. 62/867,195, filed on Jun. 26, 2019.

(51) Int. Cl.
*B81B 3/00* (2006.01)
*B81C 1/00* (2006.01)

(52) U.S. Cl.
CPC ........ *B81B 3/0067* (2013.01); *B81C 1/00349* (2013.01); *B81C 1/00444* (2013.01); *B81B 2207/11* (2013.01); *B81C 1/00158* (2013.01)

(58) Field of Classification Search
CPC .......................... B81B 3/0067; B81B 2207/11
See application file for complete search history.

(56) References Cited

U.S. PATENT DOCUMENTS

| | | | |
|---|---|---|---|
| 7,402,449 B2 | 7/2008 | Fukuda et al. | |
| 9,018,717 B2 | 4/2015 | Knipe et al. | |
| 10,029,914 B2 | 7/2018 | Huffman et al. | |
| 10,224,164 B2 | 3/2019 | Van Kampen et al. | |
| 10,566,140 B2 | 2/2020 | Knipe et al. | |
| 10,707,039 B2 | 7/2020 | Van Kampen et al. | |
| 10,896,787 B2 | 1/2021 | Van Kampen et al. | |
| 10,964,505 B2 | 3/2021 | Van Kampen et al. | |
| 11,114,265 B2 | 9/2021 | Van Kampen et al. | |
| 11,417,487 B2 | 8/2022 | Knipe et al. | |
| 2014/0268482 A1 | 9/2014 | DeReus et al. | |

(Continued)

OTHER PUBLICATIONS

Notice of Allowance for U.S. Appl. No. 16/907,123, dated Oct. 18, 2021, 11 pages.

(Continued)

*Primary Examiner* — Moazzam Hossain
(74) *Attorney, Agent, or Firm* — Withrow & Terranova, P.L.L.C.

(57) ABSTRACT

A method of forming a microelectromechanical device wherein a beam of the microelectromechanical device may deviate from a resting to an engaged or disengaged position through electrical biasing. The microelectromechanical device comprises a beam disposed above a first RF electrode and a second RF electrode. The microelectromechanical device further comprises one or more electrical contacts disposed below the beam. The one or more electrical contacts comprise a first layer of ruthenium disposed over an oxide layer, a titanium nitride layer disposed on the first layer of ruthenium, and a second layer of ruthenium disposed on the titanium nitride layer.

20 Claims, 20 Drawing Sheets

(56) References Cited

U.S. PATENT DOCUMENTS

| | | | |
|---|---|---|---|
| 2014/0340814 A1* | 11/2014 | Van Kampen | B81C 1/00523 |
| | | | 361/278 |
| 2016/0207763 A1 | 7/2016 | Troy et al. | |
| 2018/0033553 A1* | 2/2018 | Van Kampen | H01H 59/0009 |
| 2018/0315571 A1* | 11/2018 | Van Kampen | B81B 3/001 |
| 2018/0315748 A1* | 11/2018 | Gaddi | H01L 27/0292 |
| 2020/0399115 A1 | 12/2020 | Van Kampen et al. | |
| 2020/0399121 A1 | 12/2020 | Van Kampen et al. | |
| 2020/0402755 A1 | 12/2020 | Van Kampen et al. | |

OTHER PUBLICATIONS

Notice of Allowance for U.S. Appl. No. 16/907,138, dated Mar. 10, 2022, 8 pages.
Non-Final Office Action for U.S. Appl. No. 16/907,129, dated Oct. 4, 2022, 14 pages.
Non-Final Office Action for U.S. Appl. No. 16/907,138, dated Nov. 2, 2022, 9 pages.
Notice of Allowance for U.S. Appl. No. 16/907,138, dated Jul. 13, 2022, 9 pages.
Notice of Allowance for U.S. Appl. No. 16/907,129, dated Apr. 21, 2023, 9 pages.
Final Office Action for U.S. Appl. No. 16/907,129, dated Feb. 2, 2023, 16 pages.

* cited by examiner

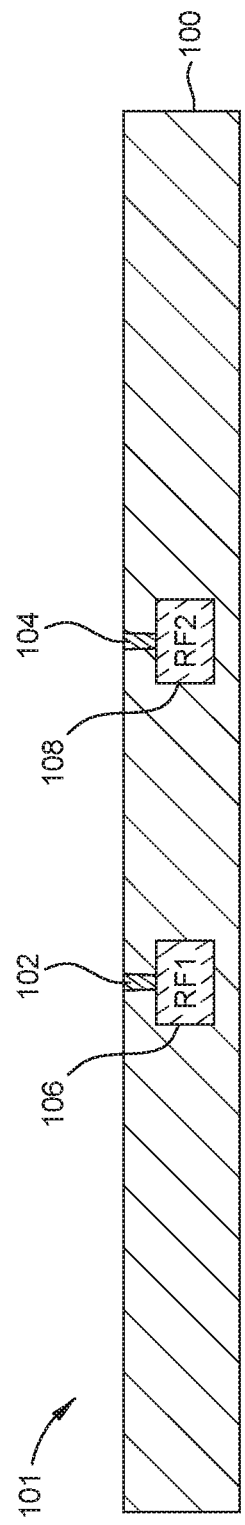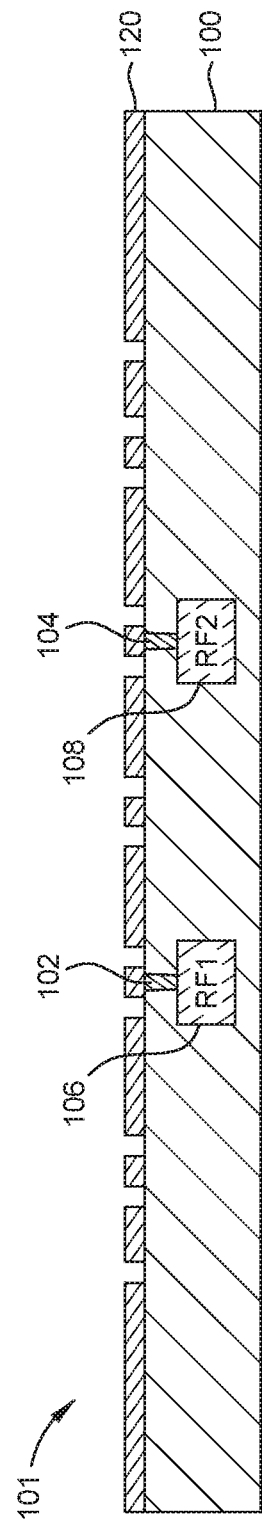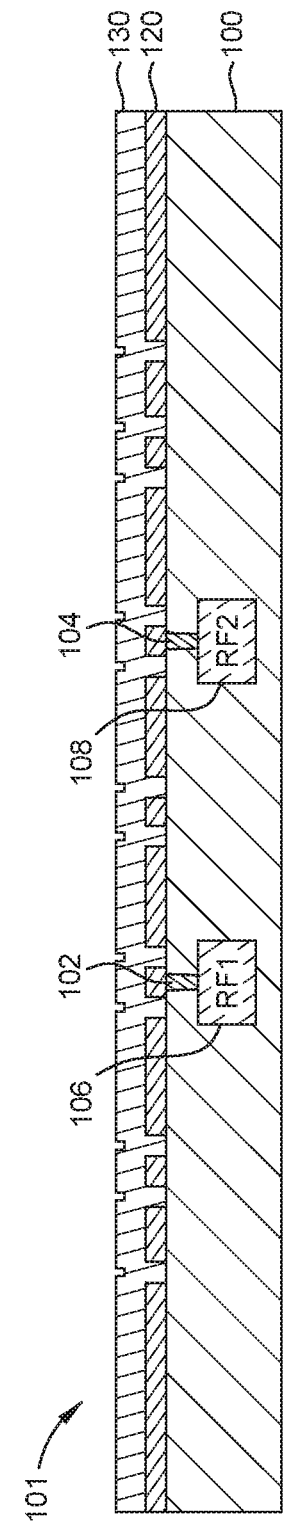

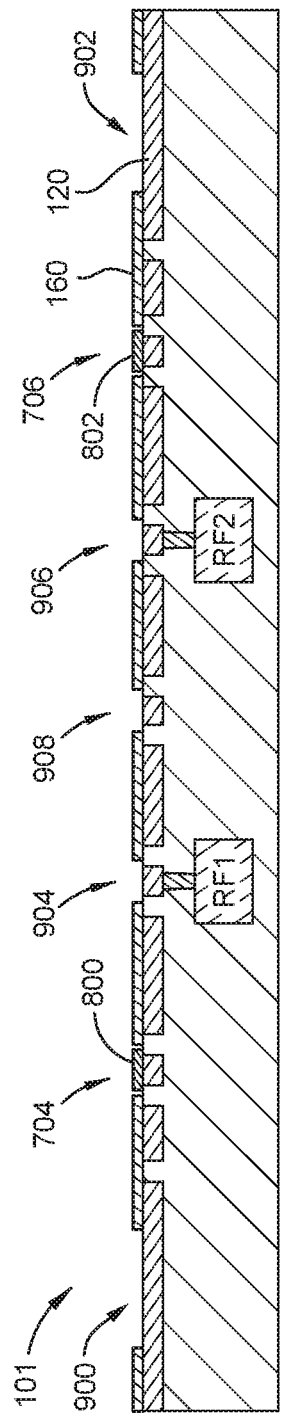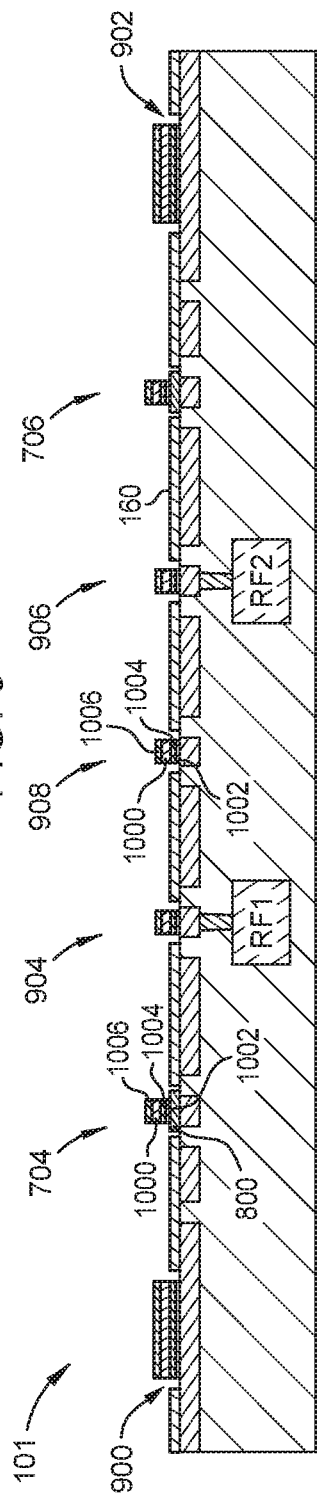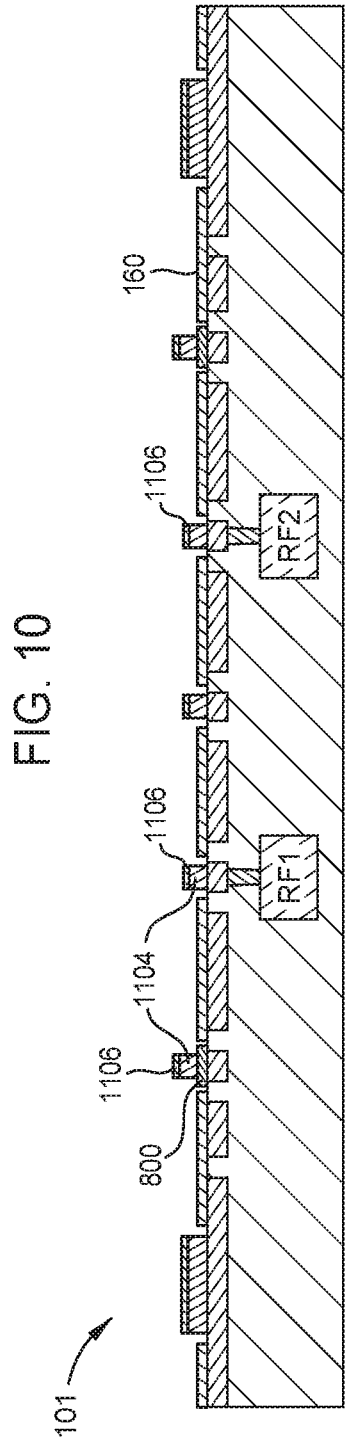

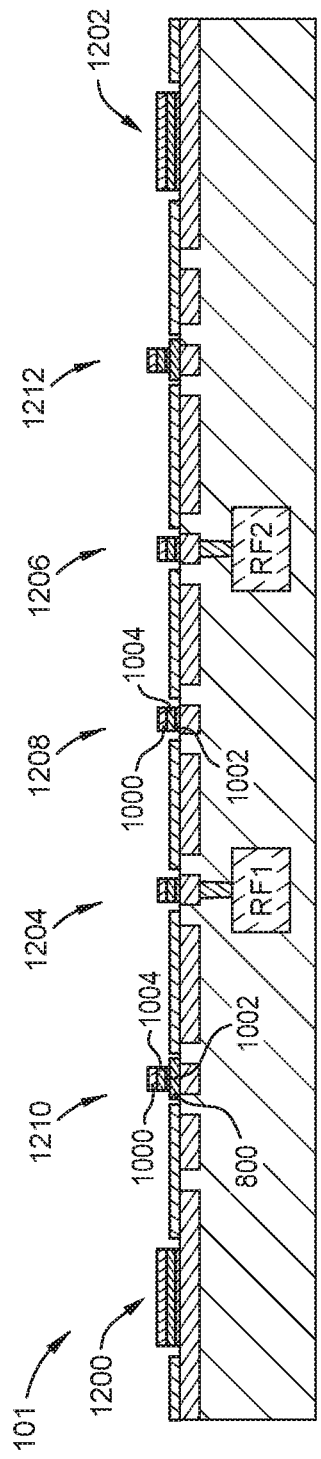
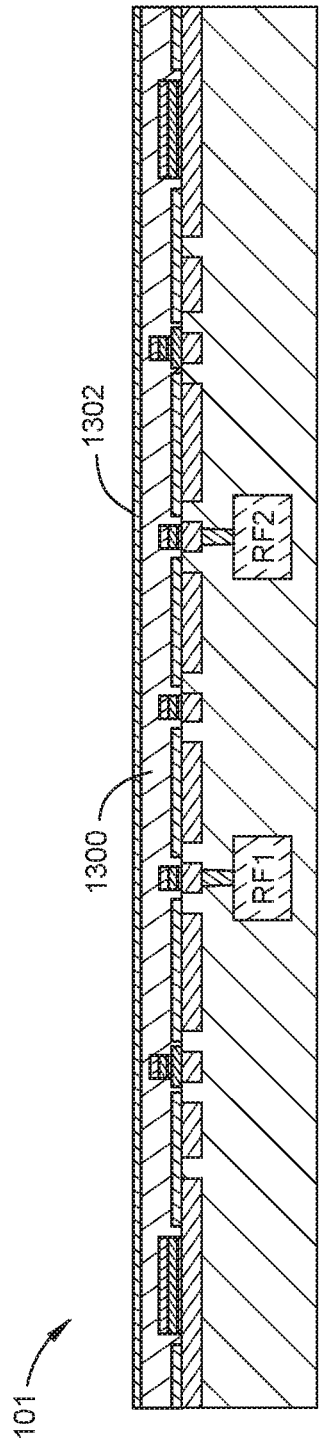
FIG. 12
FIG. 13

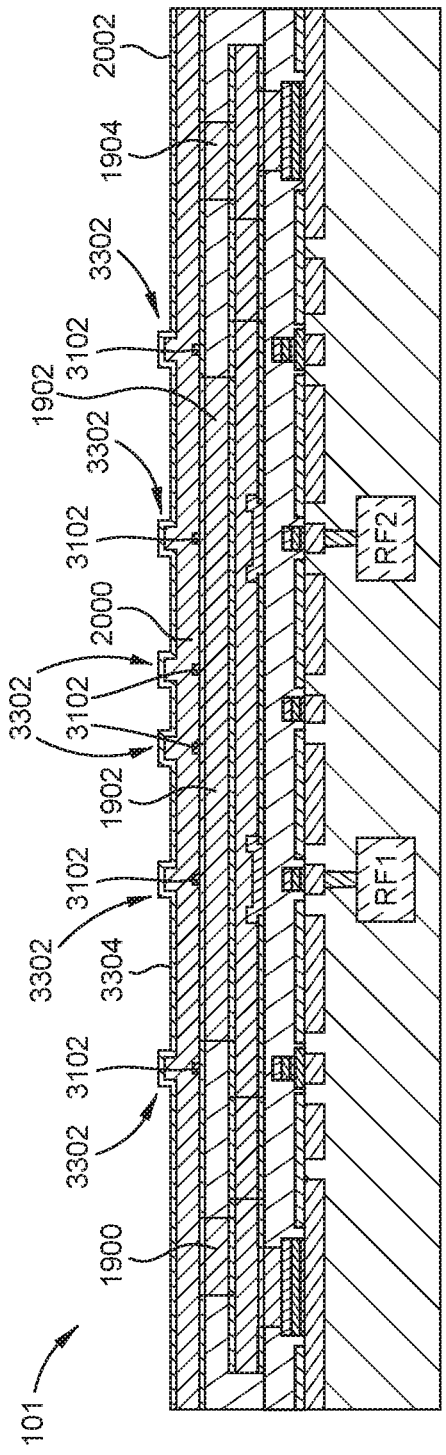
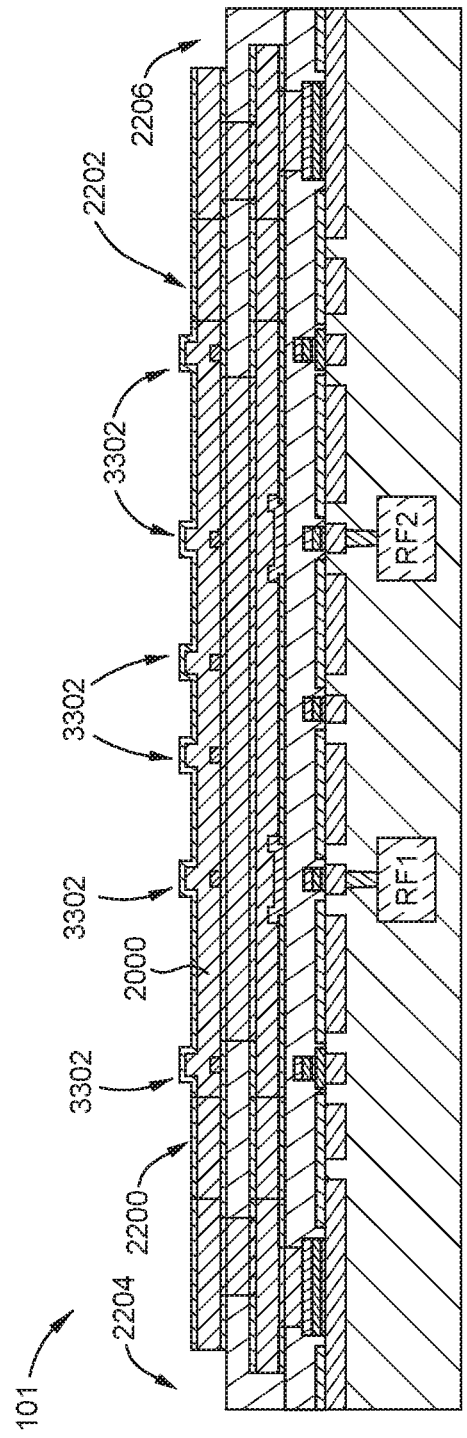
FIG. 33
FIG. 34

MEMS DEVICE HAVING UNIFORM CONTACTS

RELATED APPLICATIONS

This application claims the benefit of U.S. provisional patent application No. 62/867,195, filed Jun. 26, 2019; and U.S. provisional patent application 62/879,185, filed Jul. 26, 2019, the disclosures of which are incorporated herein by reference in their entireties.

This application is related to U.S. patent application Ser. No. 16/907,123, filed concurrently herewith, entitled METHOD OF FORMING A FLEXIBLE MEMS DEVICE, which claims the benefit of U.S. provisional application No. 62/865,198 filed Jun. 22, 2019; U.S. patent application Ser. No. 16/907,129, filed concurrently herewith, entitled STABLE LANDING ABOVE RF CONDUCTOR IN MEMS DEVICE, which claims the benefit of U.S. provisional application No. 62/865,199 filed Jun. 22, 2019; and U.S. patent application Ser. No. 16/907,138, filed concurrently herewith, entitled FLEXIBLE MEMS DEVICE HAVING HINGED SECTIONS, which claims the benefit of U.S. provisional application No. 62/865,201 filed Jun. 22, 2019, the disclosures of which are incorporated herein by reference in their entireties.

FIELD OF THE DISCLOSURE

Embodiments of the disclosure generally relate to electrical structures created through deposition methods. More specifically, aspects of the disclosure relate to methods and resulting microelectromechanical (MEMS) devices for use in electrical circuits.

BACKGROUND

With the advent of microelectronics, manufacturers are challenged to provide solutions to electrical problems that electronics users encounter. Switching of an electronic arrangement from one configuration to another configuration is a common technique in large scale electrical packages. Microelectromechanical switches may be used in many types of applications, from wireless communications to consumer products. As the footprint of consumer products can be very limited, MEMS switches provide advantages that conventional electrical arrangements cannot provide. Microelectromechanical switches can be small; however due to their size, the production of such MEMS switches can be problematic. As such, switching from one electronic configuration to another configuration can become problematic as well.

Therefore, there is a need to manufacture MEMS switches such that the production has a high yield and low defect rate.

There is a further need to provide a method to manufacture MEMS switches in a cost effective manner such that the resulting MEMS switches can be used in a variety of applications, including consumer electronics, without being cost prohibitive.

SUMMARY

A method of forming a microelectromechanical device is disclosed wherein a beam of the microelectromechanical device may deviate from a resting to an engaged or disengaged position through electrical biasing. The microelectromechanical device comprises a beam disposed above a first RF electrode and a second RF electrode. The microelectromechanical device further comprises one or more electrical contacts disposed below the beam. The one or more electrical contacts comprise a first layer of ruthenium disposed over an oxide layer, a titanium nitride layer disposed on the first layer of ruthenium, and a second layer of ruthenium disposed on the titanium nitride layer.

In one embodiment, a microelectromechanical device comprises a backplane comprising at least two electrodes, a first layer disposed on the backplane, a top electrode disposed above and spaced from the first layer, a beam disposed between the first layer and the top electrode, the beam moveable between the at least two electrodes and the top electrode, and one or more electrical contacts disposed over the first layer and spaced from the beam, the one or more electrical contacts comprising a first ruthenium layer disposed on the first layer, a titanium nitride layer disposed on the first ruthenium layer, and a second ruthenium layer disposed on the titanium nitride layer.

In another embodiment, a method of forming a microelectromechanical device comprises depositing and patterning a first layer on a backplane comprising at least two electrodes and forming one or more electrical contacts over the first layer. Forming the one or more electrical contacts comprises depositing a first ruthenium layer over the first layer, depositing a titanium nitride layer over the first ruthenium layer, depositing a second ruthenium layer over the titanium nitride layer, etching the second ruthenium layer with a first etchant, etching the titanium nitride layer with a second etchant different than the first etchant, and etching the first ruthenium layer with the first etchant. The method of forming the microelectromechanical device further comprises forming a beam above one or more electrical contacts, the beam being spaced from the one or more electrical contacts, forming a top electrode above the beam, and depositing a seal layer above the beam to enclose the beam in a cavity.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWINGS

The accompanying drawing figures incorporated in and forming a part of this specification illustrate several aspects of the disclosure, and together with the description serve to explain the principles of the disclosure.

FIG. 1 is a cross-sectional view of a backplane of a MEMS device in accordance with an example embodiment of the disclosure.

FIG. 2 is a cross-sectional view of the MEMS device of FIG. 1 having a titanium nitride layer deposited thereon in accordance with an example embodiment of the disclosure.

FIG. 3 is a cross-sectional view of the MEMS device FIG. 2 having a silicon dioxide layer deposited thereon in accordance with an example embodiment of the disclosure.

FIG. 9 is a cross-sectional view of the MEMS device of FIG. 8 with additional etched sections of the dielectric layer deposited in FIG. 6 in accordance with an example embodiment of the disclosure.

FIG. 10 is a cross-sectional view of the MEMS device of FIG. 9 with electrical contacts comprised of three layers deposit on the additional etched sections and on the base layers in accordance with an example embodiment of the disclosure.

FIG. 11 is a cross-sectional view of the MEMS device of FIG. 9 with electrical contacts comprised of a single layer of material, as an alternative to FIG. 10, deposited on the etched sections and on the base layers in accordance with an example embodiment of the disclosure.

FIG. 12 is a cross-sectional view of the MEMS device of FIG. 10 having removed a hardmask layer from the electrical contacts in accordance with an example embodiment of the disclosure.

FIG. 13 is a cross-sectional view of the MEMS device of FIG. 12 having a spun layer and first dielectric layer deposited thereon in accordance with an example embodiment of the disclosure.

FIGS. 31-35 illustrate an alternative embodiment for forming a plurality of top bumps on a top beam layer of the MEMS device in accordance with an example embodiment of the disclosure.

To facilitate understanding, identical reference numerals have been used, where possible, to designate identical elements that are common to the Figures. It is contemplated that elements and features of one embodiment may be beneficially incorporated in other embodiments without further recitation.

DETAILED DESCRIPTION

Figure 4:
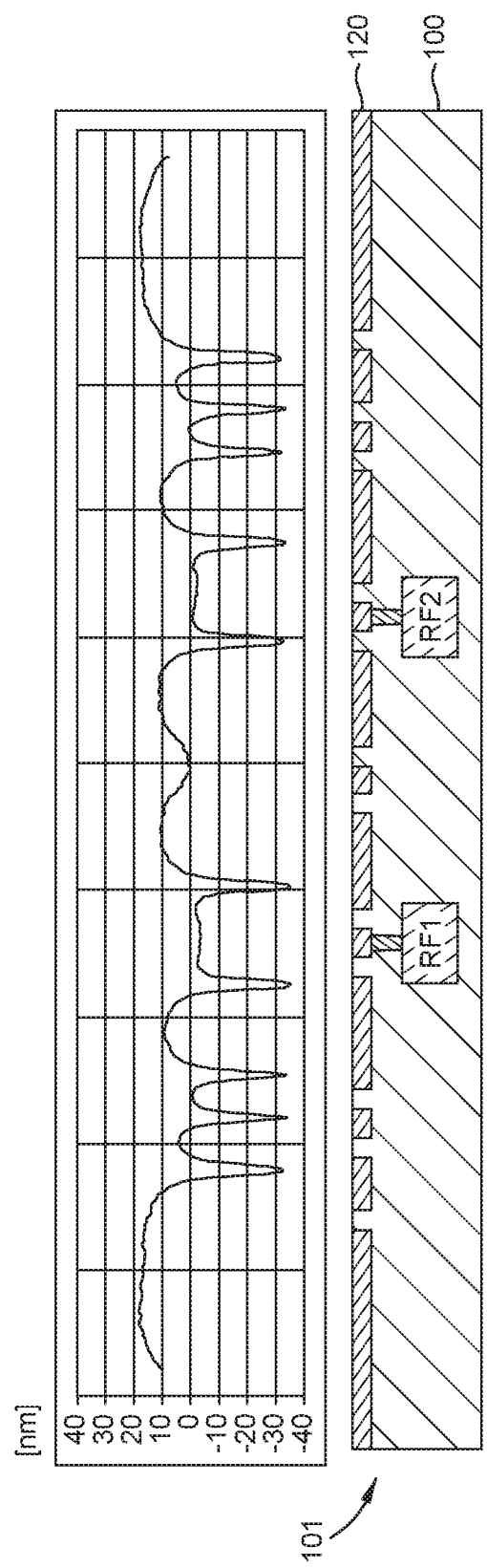
FIG. 4 is a cross-sectional view of the MEMS device of FIG. 3 after a chemical mechanical planarization in accordance with an example embodiment of the disclosure.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

A method of forming a microelectromechanical device is disclosed wherein a beam of the microelectromechanical device may deviate from a resting to an engaged or disengaged position through electrical biasing. The microelectromechanical device comprises a beam disposed above a first RF electrode and a second RF electrode. The microelectromechanical device further comprises one or more electrical contacts disposed below the beam. The one or more electrical contacts comprise a first layer of ruthenium disposed over an oxide layer, a titanium nitride layer disposed on the first layer of ruthenium, and a second layer of ruthenium disposed on the titanium nitride layer.

Some embodiments will now be described with reference to the figures. Like elements in the various figures will be referenced with like numbers for consistency. In the following description, numerous details are set forth to provide an understanding of various embodiments and/or features. It will be understood, however, by those skilled in the art that some embodiments may be practiced without many of these details and that numerous variations or modifications from the described embodiments are possible. As used herein, the terms "above" and "below", "up" and "down", "upper" and "lower", "upwardly" and "downwardly", and other like terms indicating relative positions above or below a given point or element are used in this description to more clearly describe certain embodiments.

In the description that follows, method steps are disclosed to produce a MEMS device or MEMS switch useful in a variety of applications. The method discloses comprises various steps of material deposition, etching, and chemical and/or mechanical surface preparation. Various materials, such as silicon dioxide, titanium nitride, and ruthenium, as non-limiting embodiments, are used in production of the MEMS switch. Variations from the materials described may be accomplished for certain applications where alternative materials would produce desired results. Variations from approximate dimensions of various materials removed or deposited are also contemplated, therefore thicker or thinner variations of the description will be understood to be within the methods described.

The methods and apparatus provide for a MEMS device that has a single or multiple beams that are created through various deposition and etching steps to provide a switch that may be switched to from a resting state to an "on" state or an "off" state depending on electrical biasing. The beams are created within cavities that are created within the structure. The cavities are created through various material removal techniques wherein portions on the overall structures are removed, with the result being a beam extending inside the cavity. Such MEMS devices can be made such that greater or lesser amounts of biasing current cause deflection of the beams within the MEMS device. As will be understood, a thicker beam structure would require greater amounts of electrical biasing to move the beam rather than a thinner beam. In the embodiments disclosed, both thicker and thinner beams are contemplated as part of the disclosure. In other embodiments, beams or different sections of beams may be created to create longer effective spans for use. Such longer beams may have supports along the length of the beam to prevent from inadvertent electrical actuation or short circuiting.

A method will be described, in FIGS. 1-30, wherein different steps for making the MEMS device are described. In some figures, alternative methods may be discussed or described. Such alternative methods should not be considered exclusive, as other embodiments may be possible to perform similar functions or produce similar structures.

In some embodiments an "etch" is described. As defined, an etch may be a wet type etching or dry type etching. Such etching removes material to an as-needed or desired profile. Etching may be accomplished through a timed etch, for example, wherein a known amount of material per unit time is removed. In a similar fashion, "patterning" is also described. Patterning may be done through photolithographic methods and layers of different materials that are either photo resistant or not may be used. Thus, where a reactive material is incorporated into an arrangement and that reactive material is exposed to light, the reactive material may be removed from the overall arrangement. In the description that follows, therefore, patterning may apply to both the exposure of materials to a radiation source and subsequent removal of materials from the structures.

In embodiments, materials such as titanium nitride or silicon dioxide are described. Such materials are only examples of materials that may be used in the construction or permanent arrangements described. As examples, different types of "resist" layers may be used that will be incorporated into the permanent structures, while other material layers may include differing dielectric materials. As a result, the express mention of a specific material should only be considered as an example material that may be used in the finalized structures. Furthermore, deposition of these materials may be performed through spinning methods, vapor deposition, or other types of method.

In other embodiments, after etching, cleaning steps may or may not be disclosed. Cleaning methods may be "wet clean" steps of using fluids to remove impurities from the created structures. Other cleaning methods may include more aggressive means for removing materials such as mechanical and or chemical methods. The presence of a specific cleaning step or the non-identification of a specific cleaning step does not necessarily require or eliminate the cleaning step.

FIGS. 1-30 illustrate a sequential sequence of forming a MEMS device 3000, according to one embodiment.

Referring to FIG. 1, a backplane 100 of an arrangement 101 is illustrated. The backplane 100 provides a substrate from which other structures will be constructed in embodiments of the disclosure. The backplane 100 comprises a first radiofrequency (RF) electrode (RF1) 106 recessed into a square via of the backplane 100 with an accompanying via 102 to the surface of the backplane 100. The backplane 100 further comprises a second RF electrode (RF2) 108 recessed into a square via of the backplane 100 and spaced from the RF1 electrode 106. The RF2 electrode 108 has an accompanying via 104 to the surface of the backplane 100. The square vias recessed into the backplane 100 may have a length and width of about 0.5 µm. Recesses within the backplane 100 may be through a plug creation process. The vias 102, 104 extending to the surface may be configured with a round or square shape, as non-limiting embodiments. A wet clean may be performed on the backplane 100, as necessary, to provide a surface free from foreign materials. Voltage may be placed upon RF1 electrode 106 and RF2 electrode 108 such that a beam (described later) may deflect in an upward or downward position. While the RF1 electrode 106 and RF2 electrode 108 are referred to as RF electrodes, the RF1 electrode 106 and RF2 electrode 108 may be contact electrodes or RF conductors.

Referring to FIG. 2, a first layer 120 is deposited upon the surface of the backplane 100. The first layer 120 may comprise, as a non-limiting embodiment, titanium nitride (TiN). The first layer 120 may be deposited on the surface of the backplane 100 through a physical vapor deposition (PVD) process or a chemical vapor deposition (CVD) process. After the first layer 120 is deposited, the first layer 120 may be patterned through known processes.

Referring to FIG. 3, an oxide layer 130 is deposited over the first layer 120. The oxide layer 130 may be patterned or unpatterned as necessitated by the design. The oxide layer 130 may comprise silicon dioxide. The oxide layer 130 is a gap-filling layer that fills the gaps between the patterned surface of the first layer 120. Thus, the oxide layer 130 not only forms a separate layer, but also fills in gaps created in the first layer 120.

Referring to FIG. 4, a chemical mechanical planarization process is then performed on the arrangement 101 provided in FIG. 3. The chemical mechanical planarization (CMP) process is performed until the titanium nitride of the first layer 120 is exposed through the oxide layer 130. In one embodiment, the CMP process is an oxide CMP. As illustrated at the top of FIG. 4, a varied surface profile may then exist after the processing occurs. To resolve this varied surface profile, referring to FIG. 5, a metal based planarization is performed such that the oxide layer 130 and the first layer 120 form a substantially flat or planar surface. The final profile, illustrated in FIG. 5, is illustrated in the upper portion of FIG. 5, showing a markedly decreased profile variability.

Figure 5:
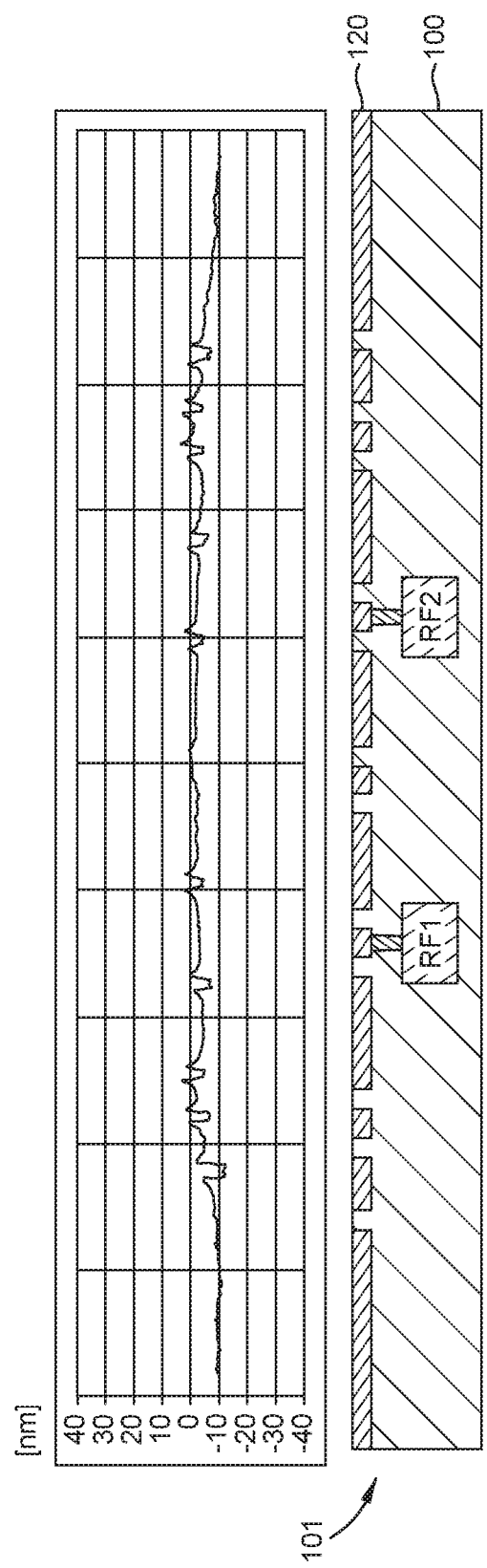
FIG. 5 is a cross-sectional view of the MEMS device of FIG. 4 after a metal chemical mechanical planarization in accordance with an example embodiment of the disclosure.
Figure 6:
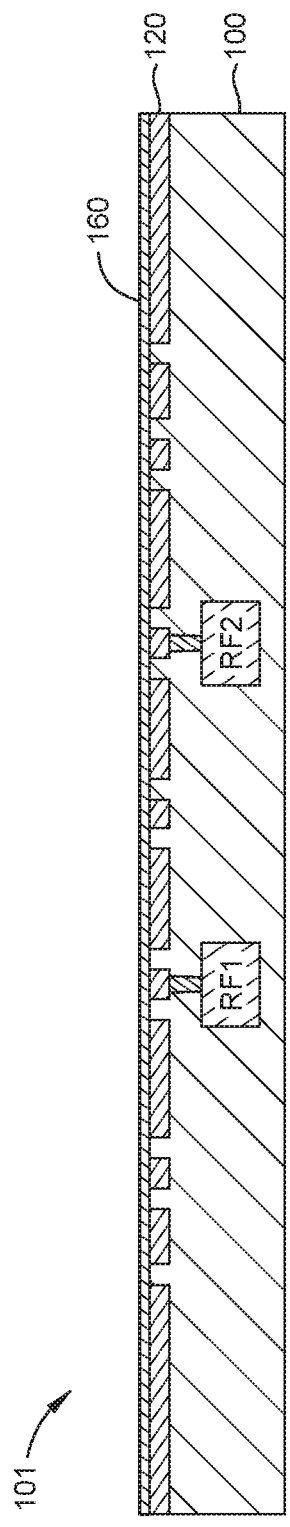
FIG. 6 is a cross-sectional view of the MEMS device of FIG. 5 having a dielectric layer deposited thereon in accordance with an example embodiment of the disclosure.

Referring to FIG. 6, a bottom dielectric layer 160 is deposited on the substantially planar surface provided in FIG. 5. The bottom dielectric layer 160, in a non-limiting embodiment, comprises silicon dioxide. As provided, the bottom dielectric layer 160 is uniform across the length of the backplane 100.

Figure 7:
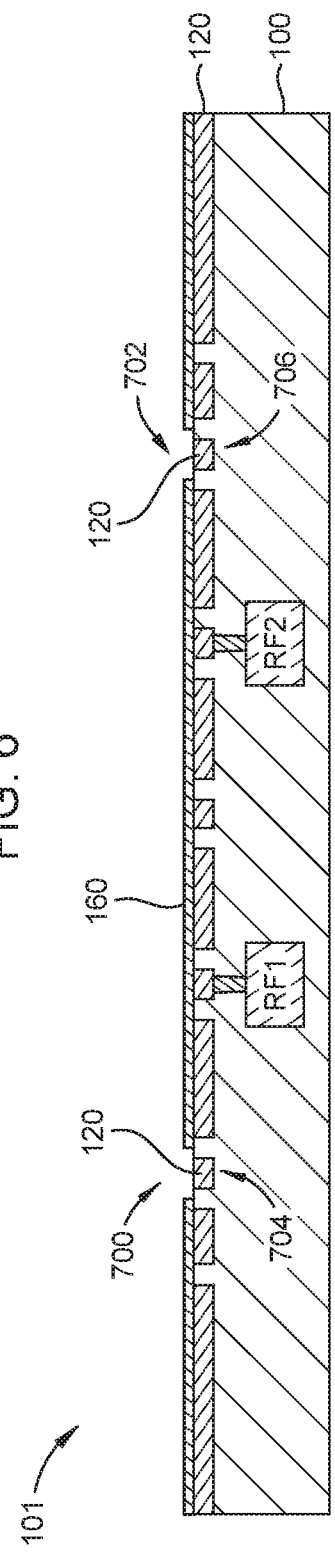
FIG. 7 is cross-sectional view of the MEMS device of FIG. 6 after the dielectric layer has been etched in sections in accordance with an example embodiment of the disclosure.

Referring to FIG. 7, the bottom dielectric layer 160 is etched to create a first opening 700 and a second opening 702 in the bottom dielectric layer 160. The bottom dielectric layer 160 is etched until the first layer 120 and/or oxide layer 130 is exposed through the first opening 700 and the second opening 702. The first opening 700 is disposed over a first portion 704 of the first layer 120 and the second opening is disposed over a second portion 706 of the first layer 120. The first and second openings 700, 702 are unaligned with the RF1 electrode 106 and the RF2 electrode 108. The etching may be a timed oxide etch, as a non-limiting embodiment.

Figure 8:
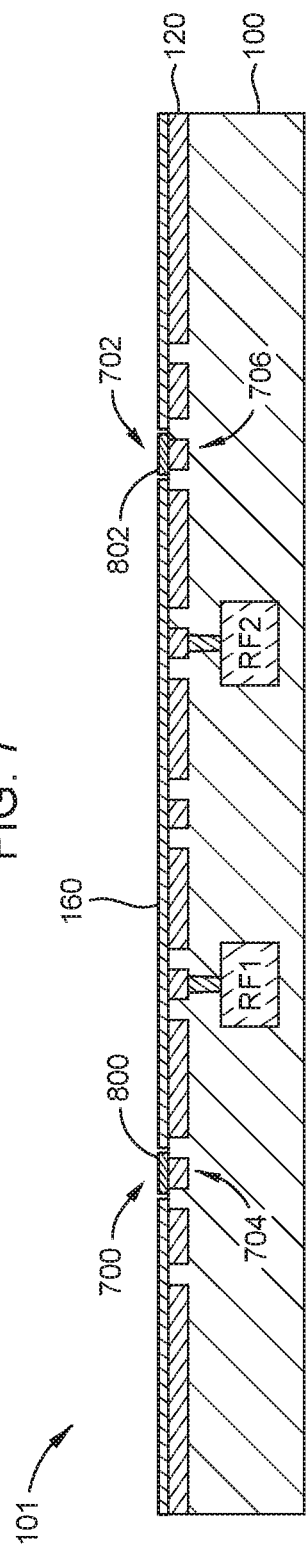
FIG. 8 is a cross-sectional view of the MEMS device of FIG. 7 having base layers formed on the etched sections of the dielectric layer in accordance with an example embodiment of the disclosure.

Referring to FIG. 8, a layer is deposited over the bottom dielectric layer 160, the first layer 120, and the oxide layer 130 to form a first base layer 800 in the first opening 700 and a second base layer 802 in the second opening 702. The layer deposited to form the first and second base layers 800, 802 is then patterned with a photolithographic process and subsequently etched to remove all portions of the layer except the first base layer 800 and the second base layer 802. The deposition of the layer forming the first and second base layers 800, 802 may be through, for example, vapor deposition. The first and second base layers 800, 802 are formed to cover most of the first and second portions 704, 706 of the first layer 120 while being spaced from the adjacent bottom dielectric layer 160. The first and second base layers 800, 802 will become the base upon which triple stacks of materials will be deposited, as described in FIG. 10, is later described.

Referring to FIG. 9, an additional etching of the bottom dielectric layer 160 is performed to expose a third portion 900, a fourth portion 902, a fifth portion 904, a sixth portion 906, and a seventh portion 908 of the first layer 120. In this embodiment, a timed etch may be performed to produce etching in areas disposed above the RF1 electrode 106 (i.e., the fifth portion 904), the RF2 electrode 108 (i.e., the sixth portion 906), a centralized zone (i.e., the seventh portion 908), a left end area (i.e., the third portion 900), and a right end area (i.e., the fourth portion 902). The third portion 900 and the fourth portion 902 exposed may have a greater size than each of the fifth portion 904, the sixth portion 906, and the seventh portion 908. The seventh portion 908 exposed may have a greater size than each of the fifth portion 904 and the sixth portion 906.

Referring to FIG. 10, a triple stack of materials is deposited on each of the exposed portions 900-908 and on the first and second base layers 800, 802 (i.e., the first and second portions 704, 706) to form electrical contacts for a beam. A bottom ruthenium (Ru) layer 1002 is first deposited, followed by a titanium nitride (TiN) layer 1004, and a top Ru layer 1000 deposited on the TiN layer 1004. A hardmask 1006 is used to ensure that patterning of the triple stacks of materials may be performed as desired. The hardmask 1006 may be a silicon dioxide hardmask. However, in one embodiment, a hardmask 1006 is not used to form the stacks of materials. Each layer 1002, 1000, 1004 is deposited over the top surface of the dielectric layer 160, first layer 120, exposed portions 900-908, and base layers 800, 802, and then patterned through a lithographic process and subsequently etched to form the triple stacks of materials. The bottom Ru layer 1002 may have a thickness of about 50 angstroms to about 300 angstroms, the TiN layer 1004 may have a thickness of about 500 angstroms to about 1500 angstroms, and the top Ru layer 1000 may have a thickness of about 300 angstroms to about 1200 angstroms.

The hardmask 1006, if utilized, may first be etched with a third etchant having a high selectivity for oxide compared to Ru. The top Ru layer 1000 may then be etch stopped on the underlying TiN layer 1004 using a first etchant having a high selectivity for ruthenium compared to TiN. The TiN layer 1004 acts as an etch stop for the top Ru layer 1000 such that the top Ru layer 1000 may be over-etched as needed without etching the TiN layer 1004. The TiN layer 1004 may be etch stopped on the underlying bottom Ru layer 1002 using a second etchant different than the first and third etchants. The second etchant has a high selectivity for TiN compared to ruthenium. The bottom Ru layer 1002 acts as an etch stop for the TiN layer 1004 such that the TiN layer 1004 may be over-etched as needed without etching the bottom Ru layer 1002. The bottom Ru layer 1002 may be etch stopped on the underlying first layer 120 or underlying base layer 800, 802 using the first etchant having a high selectivity for ruthenium compared to TiN and oxides. The underlying first layer 120 or underlying base layer 800, 802 acts as an etch stop for the bottom Ru layer 1002 such that the bottom Ru layer 1002 can be over-etched as needed without etching either the underlying first layer 120 or underlying base layer 800, 802.

By using the underlying first layer 120 or underlying base layer 800, 802 as an etch stop for the bottom Ru layer 1002, the loss of material from the underlying first layer 120 or underlying base layer 800, 802 is minimized. Thus, the underlying first layer 120 or underlying base layer 800, 802 maintain the same properties as when initially deposited. Moreover, using each previously deposited and etched layer as an etch stop for the layer disposed on top allows each layer to be uniformly deposited and further allows the electrical contact formation process to be highly controlled. As such, the overall uniformity of the electrical contacts is increased, and the various heights of the electrical contacts are accurately controlled.

Additionally, because electrical contacts are deposited on the first and second base layers 800, 802, the electrical contacts disposed in the first portion 704 and the second portion 706 have a greater height than the electrical contacts disposed in the third through seventh portions 900-908. The electrical contacts disposed in the first and second portions 704, 706 are further disposed adjacent to the first and second RF electrodes 106, 108 (i.e., are unaligned with the first and second RF electrodes 106, 108).

In one embodiment, a dual layer of material is deposited to form the electrical contacts. In such an embodiment, the dual layer may comprise only the TiN layer 1004 and the top Ru layer 1000. In such an embodiment, the hardmask 1006, if utilized, may first be etched with a third etchant having a high selectivity for oxide compared to Ru. The top Ru layer 1000 may then be etch stopped on the underlying TiN layer 1004 using the first etchant having the high selectivity for ruthenium compared to TiN. The TiN layer 1004 acts as an etch stop for the top Ru layer 1000 such that the top Ru layer 1000 may be over-etched as needed without etching the TiN layer 1004. The TiN layer 1004 may be etched on the underlying first layer 120 or underlying base layer 800, 802 using the second etchant; however, the etching of the TiN layer 1004 may result in over-etching into the underlying first layer 120 or the underlying base layer 800, 802.

Referring to FIG. 11, a cross-sectional view of the arrangement 101 of FIG. 9 is illustrated. FIG. 11 is an alternative configuration to that disclosed in FIG. 10. In this alternative embodiment, a single layer of material is deposited to form the electrical contacts. A hardmask 1106 is provided above and is used for patterning. The hardmask 1106 may be a titanium aluminum nitride hardmask or an oxide hardmask. However, in one embodiment, a hardmask 1106 is not used to form the stacks of material. Underneath the hardmask 1106 is a contact layer of ruthenium 1104. The contact layer of ruthenium 1104 may be etch stopped on an underlying first layer 120 or underlying base layer 800, 802 using a first etchant having a high selectivity for ruthenium compared to TiN and oxides. The underlying first layer 120 or underlying base layer 800, 802 acts as an etch stop for the contact layer of ruthenium 1104 such that the contact layer of ruthenium 1104 can be over-etched as needed without etching either the underlying first layer 120 or underlying base layer 800, 802. The hardmask 1106, if utilized, may be etched with a third etchant having a high selectivity for Ru. While the following Figures build off of the arrangement 101 of FIG. 10, FIG. 11 may be used throughout instead, continuing with FIG. 13.

Referring to FIG. 12, a cross-sectional view of the arrangement 101 of FIG. 10 is illustrated having the hardmask layer 1006 removed from each of the seven electrical contacts (hereinafter referred to as RF1 contact 1204, RF2 contact 1206, center contact 1208, PB1 contact 1210, PB2 contact 1212, left end contact 1200, and right end contact 1202). A photoresist (not shown) may be patterned to expose the seven electrical contacts and then removed. The RF1 contact 1204 is disposed above the RF1 electrode 106 such that the RF1 contact 1204 is aligned with the RF1 electrode 106. Similarly, the RF2 contact 1206 is disposed above the RF2 electrode 108 such that the RF2 contact 1206 is aligned with the RF2 electrode 108. The center contact 1208 is disposed between the RF1 contact 1204 and the RF2 contact 1206. The PB1 contact 1210 is disposed adjacent to the RF1 contact 1204, and the PB2 contact 1212 is disposed adjacent to the RF2 contact 1206. The left end contact 1200 is disposed adjacent to the PB1 contact 1210, and the right end contact 1202 is disposed adjacent to the PB2 contact 1212.

The PB1 contact 1210 is comprised of the first base layer 800, bottom Ru layer 1002, TiN layer 1004, and top Ru layer 1000, and the PB2 contact 1212 is comprised of the second base layer 802, bottom Ru layer 1002, TiN layer 1004, and top Ru layer 1000. Each of RF1 contact 1204, RF2 contact 1206, center contact 1208, left end contact 1200, and right end contact 1202 are individually comprised of the bottom Ru layer 1002, TiN layer 1004, and top Ru layer 1000. As such, PB1 contact 1210 and PB2 contact 1212 have a greater height than each of RF1 contact 1204, RF2 contact 1206, center contact 1208, left end contact 1200, and right end contact 1202. Additionally, the left end contact 1200 and the right end contact 1202 may have a greater width than each of the RF1 contact 1204, RF2 contact 1206, center contact 1208, PB1 contact 1210, and PB2 contact 1212. The center contact 1208 may have a greater width than each of the RF1 contact 1204, RF2 contact 1206, PB1 contact 1210, and PB2 contact 1212.

Each of RF1 contact 1204, RF2 contact 1206, center contact 1208, PB1 contact 1210, and PB2 contact 1212 is individually configured to contact the bottom of a beam, described later. In one example embodiment, during deflection of the beam, PB1 contact 1210 and PB2 contact 1212 are simultaneously contacted by the beam, followed by the center contact 1208, and then followed by the RF1 contact 1204 and the RF2 contact 1206 contacting simultaneously. In another example embodiment, during deflection of the beam, the center contact 1208 is first contacted by the beam, followed by PB1 contact 1210 and PB2 contact 1212 contacting simultaneously, and then followed by the RF1 contact 1204 and the RF2 contact 1206 contacting simultaneously. In either embodiment, the RF1 contact 1204 and the RF2 contact 1206 contact the beam last. As such, the impact of the actuating beam occurs on the center contact 1208 and/or the PB1 and PB2 contacts 1210, 1212. In embodiments, the contact of the PB1 contact 1210, PB2 contact 1212, and center contact 1208 may cause the beam contact area to perform as a hinge area. Each of RF1 contact 1204, RF2 contact 1206, center contact 1208, PB1 contact 1210, PB2 contact 1212, left end contact 1200, and right end contact 1202 may act as supports for the beam when the beam is deflected downwards towards the electrical contacts.

Referring to FIG. 13, a first spun layer 1300 and a first dielectric layer 1302 are deposited over the entire top of the arrangement 101 of FIG. 12. The first spun layer 1300 may be spun and the first dielectric layer 1302 may be deposited with known means. The first spun layer 1300 may be a sacrificial layer. The first dielectric layer 1302 may be comprised of silicon dioxide.

Figure 14:
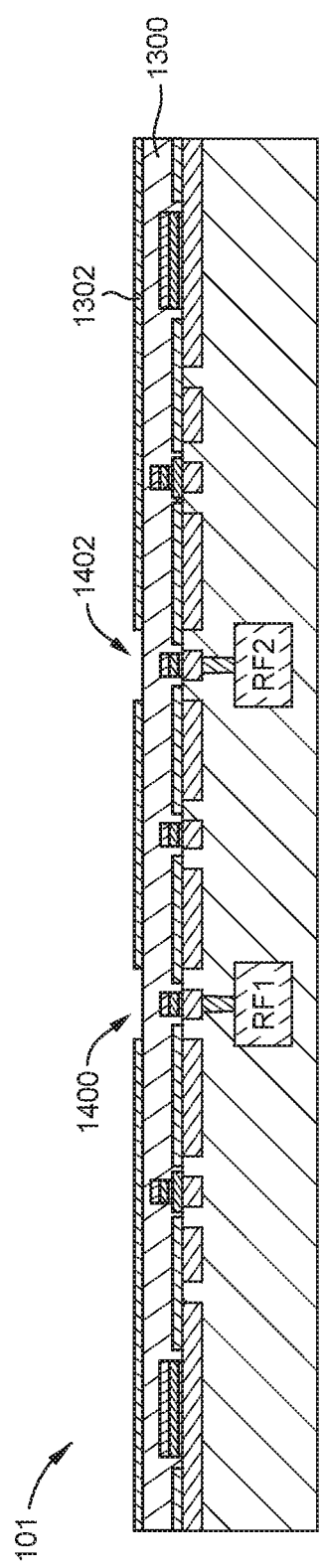
FIG. 14 is a cross-sectional view of the MEMS device of FIG. 13 having etched areas of the first dielectric layer in accordance with an example embodiment of the disclosure.

Referring to FIG. 14, areas 1400, 1402 of the first dielectric layer 1302 disposed above and aligned with the RF1 electrode 106 and the RF2 electrode 108 are removed from the arrangement 101 of FIG. 13. The removed areas 1400, 1402 may have a greater width than the RF1 contact 1204 and the RF2 contact 1206 disposed below. The removed areas 1400, 1402 are provided for a beam contact layer, as described in FIG. 15. The removed areas 1400, 1402 may be removed by etching.

Figure 15:
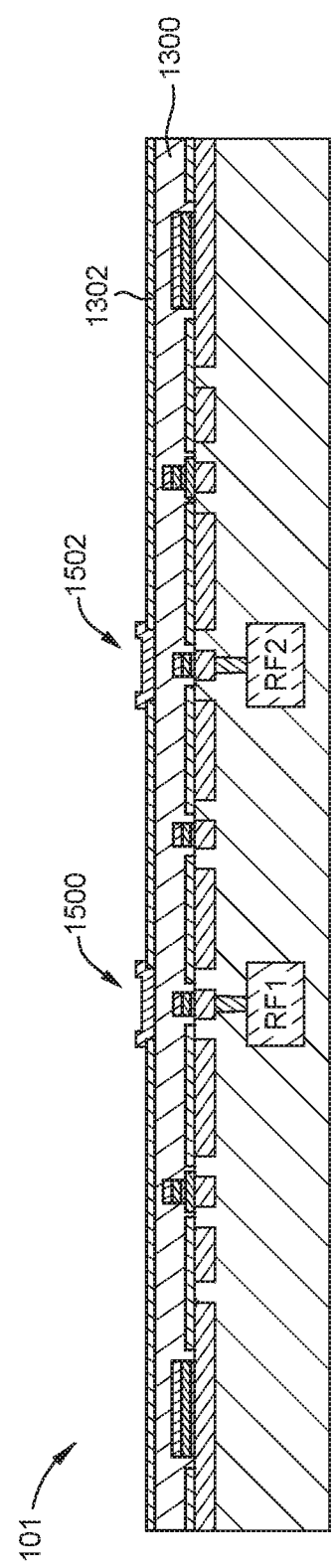
FIG. 15 is a cross-sectional view of the MEMS device of FIG. 14 having a deposited beam contact layer deposited in the etched areas of the first dielectric layer in accordance with an example embodiment of the disclosure.

Referring to FIG. 15, beam contact layers 1500, 1502 are deposited in the removed areas 1400, 1402 of FIG. 14 and patterned. The beam contact layers 1500, 1502 are disposed above and aligned with the RF1 electrode 106 and the RF2 electrode 108. The beam contact layers 1500, 1502 may comprise ruthenium. The beam contact layers 1500, 1502 may have the same width as the removed areas 1400, 1402 such that the beam contact layers 1500, 1502 have a greater width than the RF1 contact 1204 and the RF2 contact 1206. The beam contact layers 1500, 1502 are configured to accept or contact a bottom beam layer, described in relation to FIG. 17. The beam contact layers 1500, 1502 are further configured to facilitate ohmic contact to the underlying RF1 electrode 106 and RF2 electrode 108 through the contact of the bottom beam layer.

Figure 16:
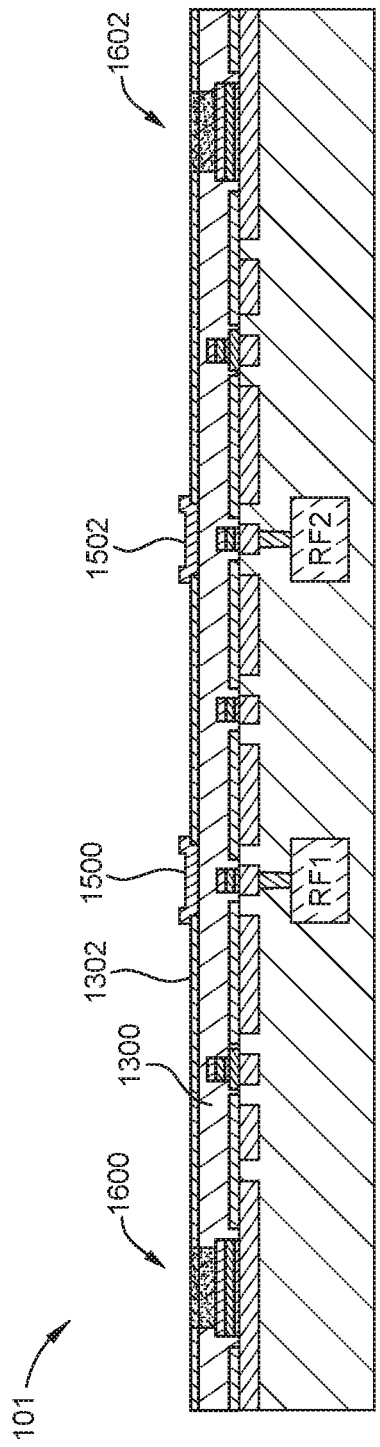
FIG. 16 is a cross-sectional view of the MEMS device of FIG. 15 with portions of the first spun layer patterned in accordance with an example embodiment of the disclosure.

Referring to FIG. 16, a cross-sectional view of the arrangement 101 of FIG. 15 is disclosed having patterned anchor sections 1600, 1602. The patterned anchor sections 1600, 1602 are formed by patterning the first spun layer 1300 and the first dielectric layer 1302 disposed above the left end contact 1200 and right end contact 1202. The patterned anchor sections 1600, 1602 are in contact with the top Ru layer 1000 of both the left end contact 1200 and the right end contact 1202. The patterned sections 1600, 1602 will be used to anchor future created portions, such as a beam.

Figure 17:
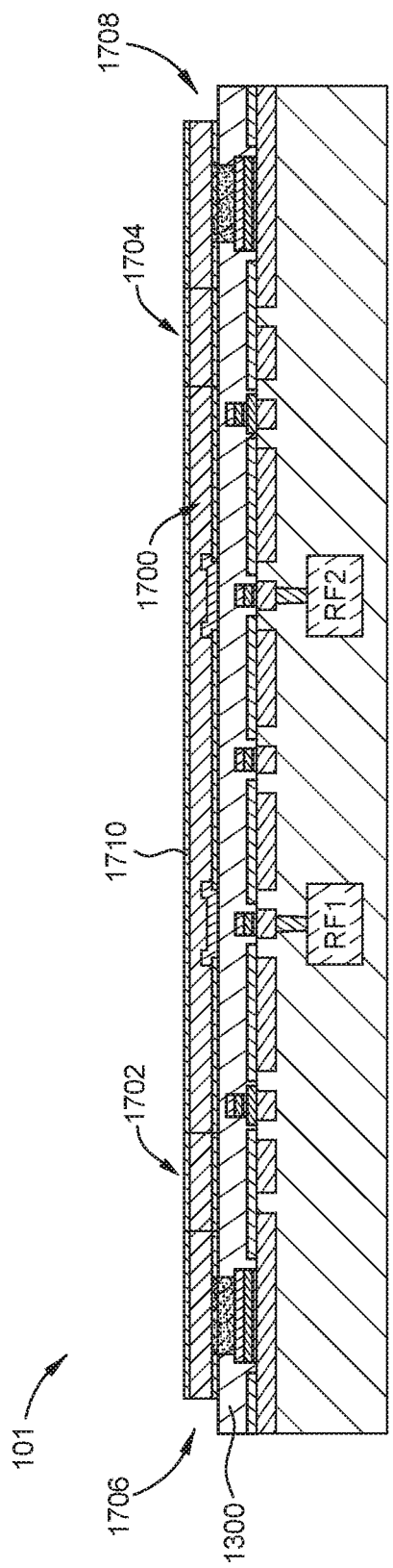
FIG. 17 is a cross-sectional view of the MEMS device of FIG. 16 having a bottom beam layer deposited thereon in accordance with an example embodiment of the disclosure.

Referring to FIG. 17, a bottom beam layer 1700 and a first additional beam layer 1710 are deposited on the arrangement 101 of FIG. 16. The first additional beam layer 1710 may comprise a dielectric material. The bottom beam layer 1700 and the first additional beam layer 1710 are then etched to comprise etched areas 1706, 1708 disposed at both ends of the arrangement 101, reducing the overall length of both the bottom beam layer 1700 and the first additional beam layer 1710. The etched areas 1706, 1708 do not extend to either patterned section 1600, 1602. Two leg areas 1702, 1704 are formed to be supportive sections for later formations. The first leg area 1702 of the bottom beam layer 1700 may be disposed between the left end contact 1200 and the PB1 contact 1210 while the second leg area 1704 of the bottom beam layer 1700 may be disposed between the right end contact 1202 and the PB2 contact 1212.

The bottom beam layer 1700 and the first additional beam layer 1710 are configured to act as one layer, hereinafter collectively referred to as the bottom beam layer 1700. The bottom beam layer 1700 is configured to deflect from a resting position to a first downward position and a second upward position. In embodiments, the deflection of the bottom beam layer 1700 is controlled such that the PB1 contact 1210 and PB2 contact 1212 contact the bottom beam layer 1700 prior to the at least the two RF contact points (i.e., RF1 contact 1204 and RF2 contact 1206).

Figure 18:
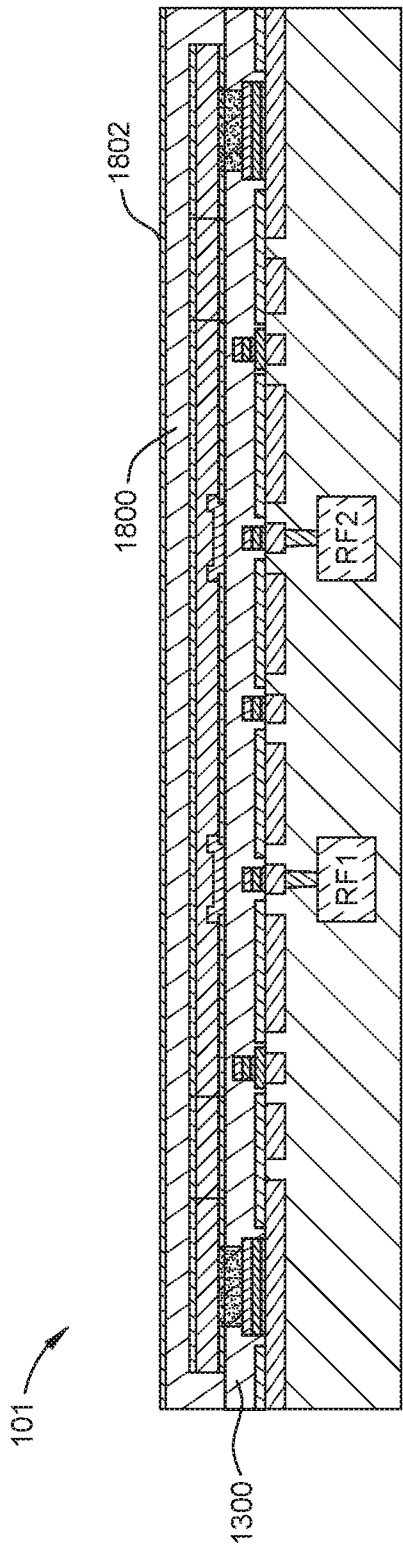
FIG. 18 is a cross-sectional view of the MEMS device of FIG. 17 having a second spun layer and a second dielectric layer deposited thereon in accordance with an example embodiment of the disclosure.

Referring to FIG. 18, a cross-sectional view of the arrangement 101 of FIG. 17 is illustrated having a second spun layer 1800 and a second dielectric layer 1802 deposited thereon. The second spun layer 1800 may be a sacrificial layer. The second dielectric layer 1802 may be a silicon dioxide layer. The second spun layer 1800 may comprise the same material as the first spun layer 1300, and the second dielectric layer 1802 may comprise the same material as the first dielectric layer 1302. The second spun layer 1800 is deposited in the patterned areas 1706, 1708 disposed at the ends of the bottom beam layer 1700 such that the second spun layer 1800 contacts a portion of the first spun layer 1300.

Figure 19:
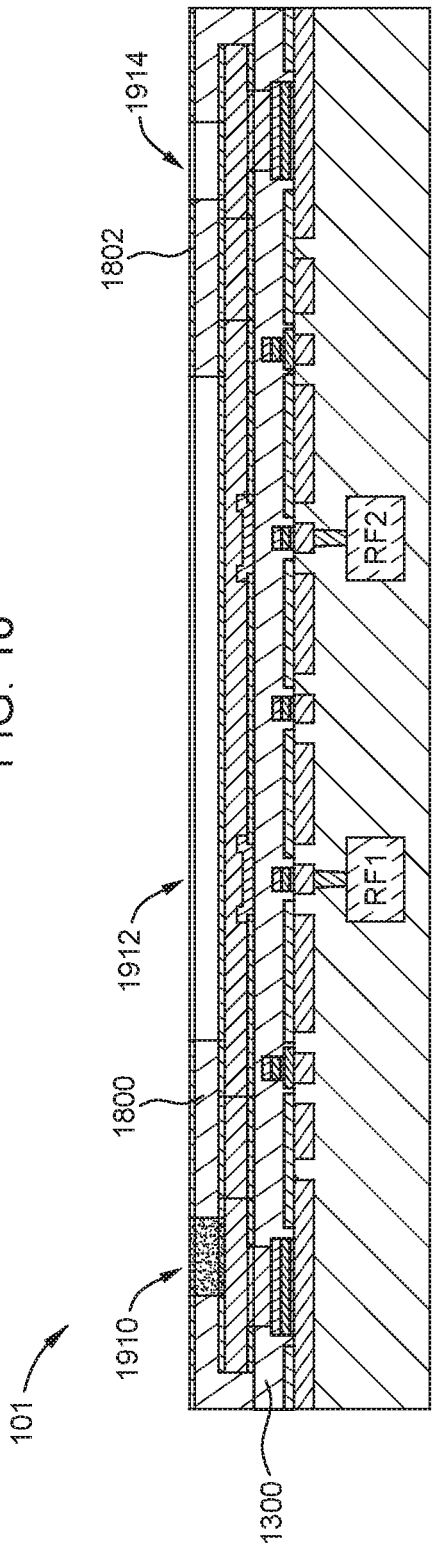
FIG. 19 is a cross-sectional view of the MEMS device of FIG. 18 with the second spun layer being patterned to create a plurality of links formed between a bottom beam and a top beam layer in accordance with an example embodiment of the disclosure.

Referring to FIG. 19, portions of the second spun layer 1800 and the second dielectric layer 1802 of the arrangement 101 of FIG. 18 are patterned to form a plurality of vias 1910, 1912, 1914 that will form a plurality of links 1900, 1902, 1904. Patterning the second spun layer 1800 and the second dielectric layer 1802 creates a plurality of links 1900, 1902, 1904 between a bottom beam (i.e., bottom beam layer 1700) and a top beam layer (shown in FIG. 20).

Figure 20:
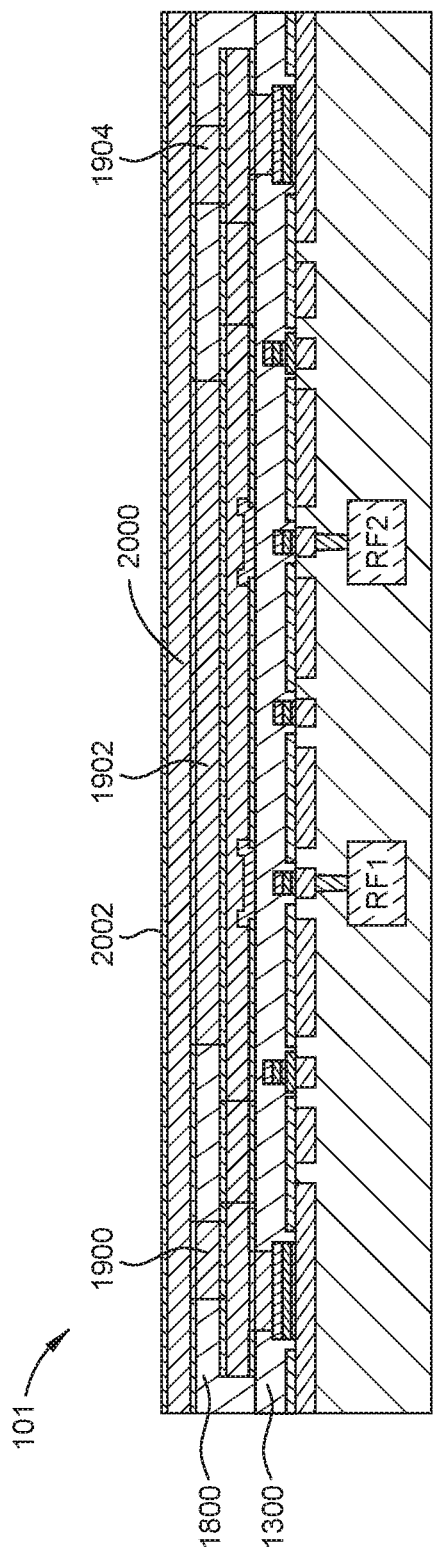
FIG. 20 is a cross-sectional view of the MEMS device of FIG. 19 having a top beam layer deposited thereon in accordance with an example embodiment of the disclosure.

Referring to FIG. 20, a cross-sectional view of the arrangement 101 of FIG. 19 is illustrated having a deposited top beam layer 2000. A second additional beam layer 2002 may be deposited on the top beam layer 2000. The second additional beam layer 2002 may comprise a dielectric material. The top beam layer 2000 and the second additional beam layer 2002 are configured to act as one layer, hereinafter collected referred to as the top beam layer 2000. The top beam layer 2000 and the second additional beam layer 2002 are also deposited within each of the etched vias in the second spun layer 1800 and on the sidewalls of the etched vias 1910, 1912, 1914 to create the plurality of links 1900, 1902, 1904 between the bottom beam layer 1700 and top beam layer 2000. The top beam layer 2000 acts as the top layer of a beam traversing cavities created in later steps.

Figure 21:
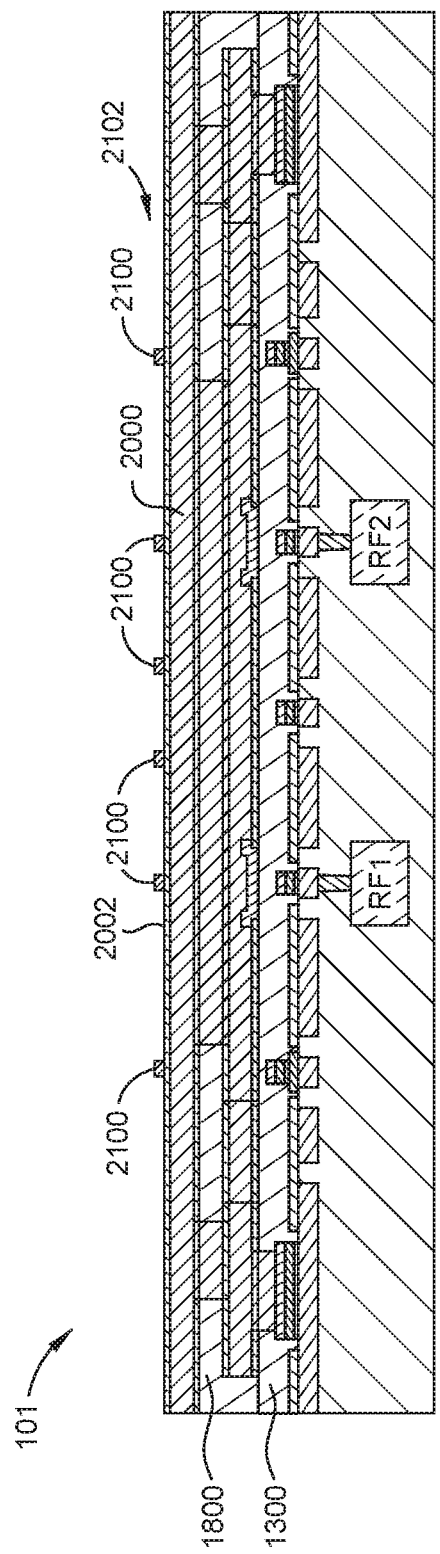
FIG. 21 is a cross-sectional view of the MEMS device of FIG. 20 a plurality of bumps deposited thereon in accordance with an example embodiment of the disclosure.

Referring to FIG. 21, a cross-sectional view of the arrangement 101 of FIG. 20 is illustrated having a plurality of bumps 2100 disposed above the top beam layer 2000. The plurality of bumps 2100 may be deposited as a one layer through chemical vapor deposition, as a non-limiting embodiment, which is then patterned to form the plurality of bumps 2100. While four bumps 2100 are shown, any number of bumps 2100 may be included, and the number of bumps 2100 shown is not intended to be limiting. Additionally, while one row 2102 of bumps 2100 is shown, additional rows of bumps may be included. The plurality of bumps 2100 are used to contact a layer disposed above the top beam layer 2000 to prevent the top beam layer 2000 from directly contacting the layer disposed above the top beam layer 2000.

Figure 22:
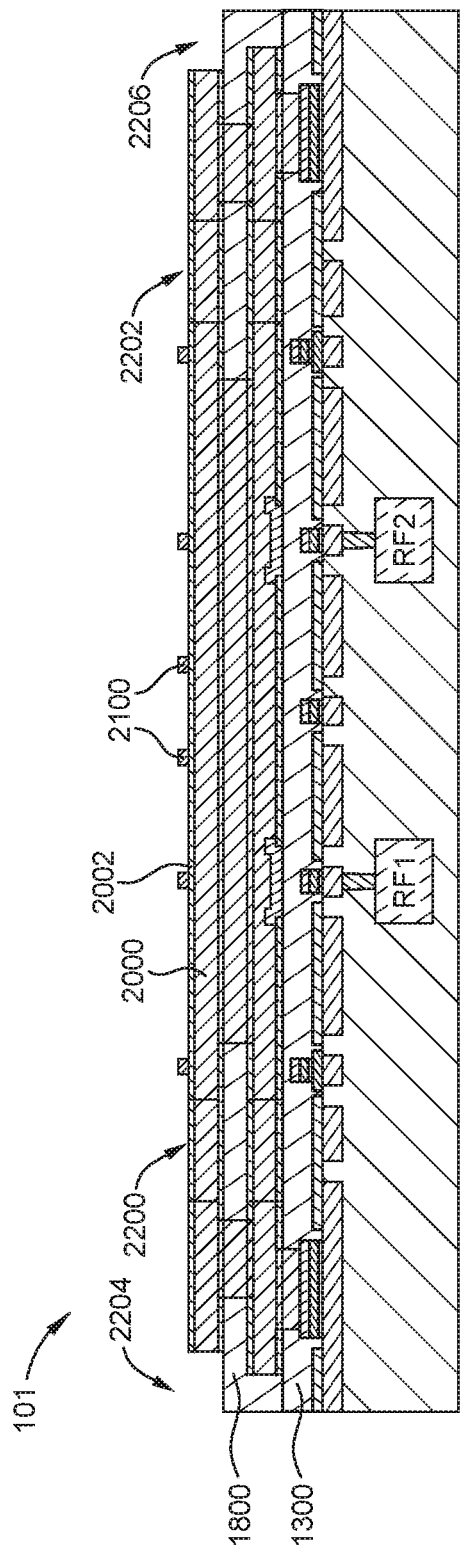
FIG. 22 is a cross-sectional view of the MEMS device of FIG. 21 with a patterned top beam layer in accordance with an example embodiment of the disclosure.

Referring to FIG. 22, the top beam layer 2000 is etched at the ends 2204, 2206 of the arrangement 101 to remove a portion of the top beam layer 2000 from each end 2004, 2006. The top beam layer 2000 may be etched to have a shorter length than the bottom beam layer 1700 (i.e., a greater amount of material of the top beam layer 2000 may be removed than is removed from the bottom beam layer 1700). A third leg 2200 and a fourth leg 2202 are then formed in the top beam layer 2000. The third leg 2200 and the fourth leg 2202 may be disposed above or aligned with the first leg 1702 and the second leg 1704.

Figure 23:
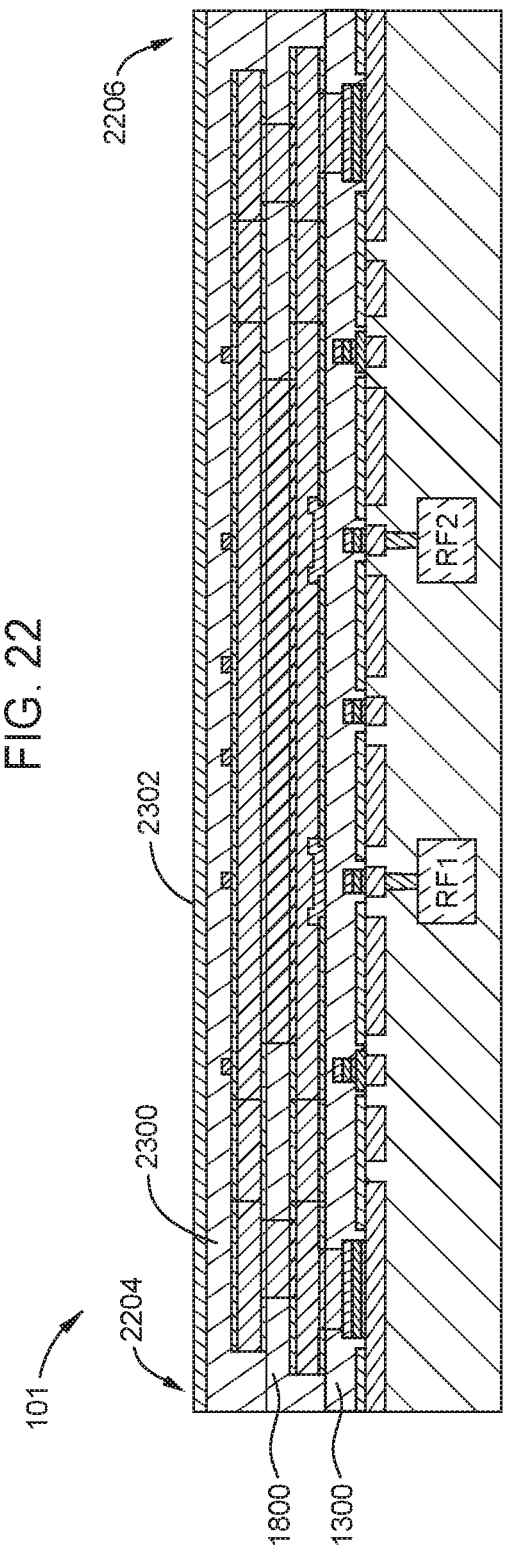
FIG. 23 is a cross-sectional view of the MEMS device of FIG. 22 having a third spun layer and third deposited dielectric layer deposited thereon in accordance with an example embodiment of the disclosure.

Referring to FIG. 23, a third spun layer 2300 and third dielectric layer 2302 are deposited over the plurality of bumps 2100 and the top beam layer 2000 of the arrangement 101 of FIG. 22. The third spun layer 2300 may be a sacrificial layer. The third dielectric layer 2302 may be a silicon dioxide layer. The third spun layer 2300 may comprise the same materials as the first spun layer 1300 and/or the second spun layer 1800, and the third dielectric layer 2302 may comprise the same material as the first dielectric layer 1302 and/or the second dielectric layer 1802. The third dielectric layer 2302 may have a greater thickness than the first dielectric layer 1302 and/or the second dielectric layer 1802. The third spun layer 2300 is deposited over each end 2004, 2006 such that portions of the third spun layer 2300 contact portions of the second spun layer 1800.

Figure 24:
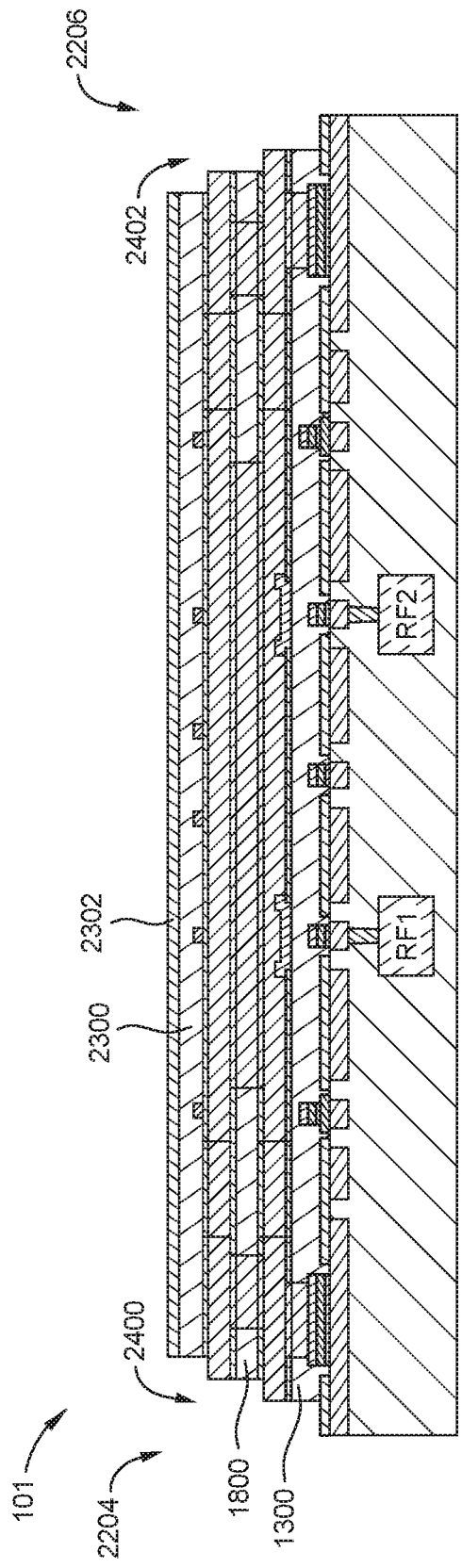
FIG. 24 is a cross-sectional view of the MEMS device of FIG. 23 having etched ends in accordance with an example embodiment of the disclosure.

Referring to FIG. 24, a cross-sectional view of the arrangement 101 of FIG. 23 is illustrated having etched portions 2400, 2402 disposed at both ends 2204, 2206 of the arrangement 101. The etched portions 2400, 2402 are formed to create a cavity for the arrangement 101. The etched portions 2400, 2402 are formed by etching a portion of the first spun layer 1300, the second spun layer 1800, and the third spun layer 2300. The first spun layer 1300 may be etched to be aligned or flush with the bottom beam layer 1700. The second spun layer 1800 may be etched to be aligned or flush with the top beam layer 2000. The third spun layer 2300 may be etched to have a length less than the top beam layer 2000.

Figure 25:
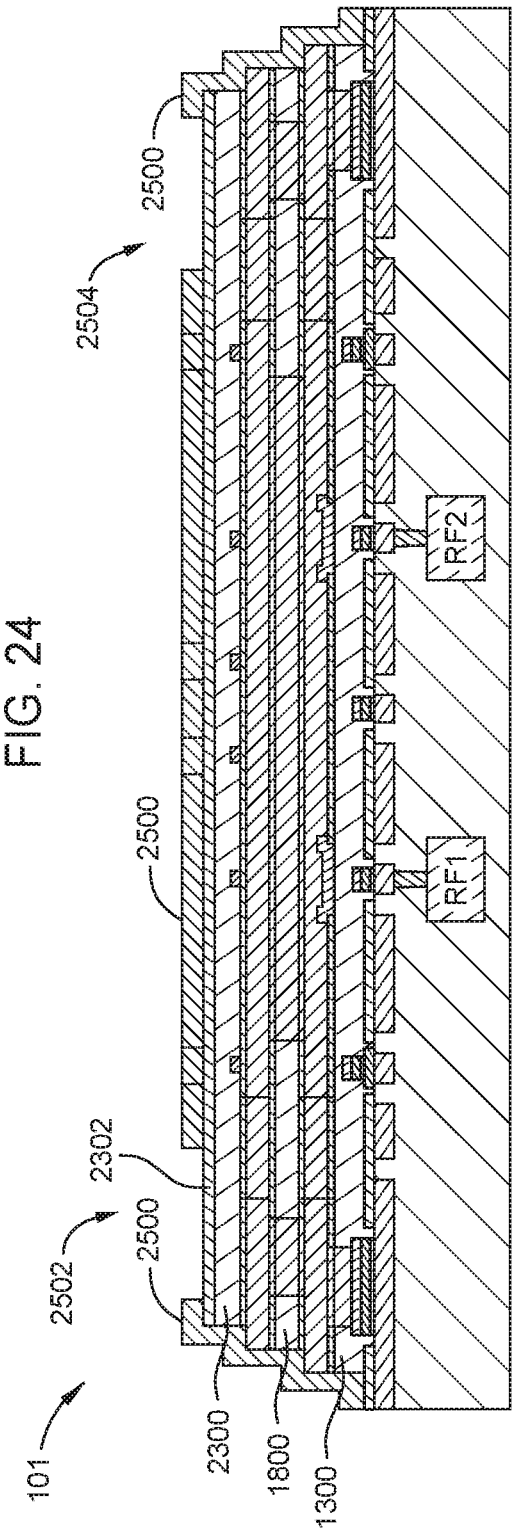
FIG. 25 is cross-sectional view of the MEMS device of FIG. 24 having a partial cavity layer deposited thereon of the deposited layer in accordance with an example embodiment of the disclosure.

Referring to FIG. 25, a partial cavity layer 2500 is deposited on the arrangement 101 of FIG. 24 and areas 2502, 2504 of the partial cavity layer 2500 are removed by etching. The partial cavity layer 2500 is deposited over the etched portions 2400, 2402 and on the third dielectric layer 2302. Thus, the partial cavity layer 2500 contacts at least the first spun layer 1300, the first dielectric layer 1302, the bottom beam layer 1700, the second spun layer 1800, the second dielectric layer 1802, the top beam layer 2000, the third spun layer 2300, and the third dielectric layer 2302. The areas 2502, 2504 of the partial cavity layer 2500 are then etched such that portions of the third dielectric layer 2302 disposed above the left end contact 1200 and the right end contact 1202 are exposed. The partial cavity layer 2500 disposed above the top beam layer 2000 forms a top electrode and is used to pull the formed MEMS beam, completed as described later, to an upward position.

Figure 26:
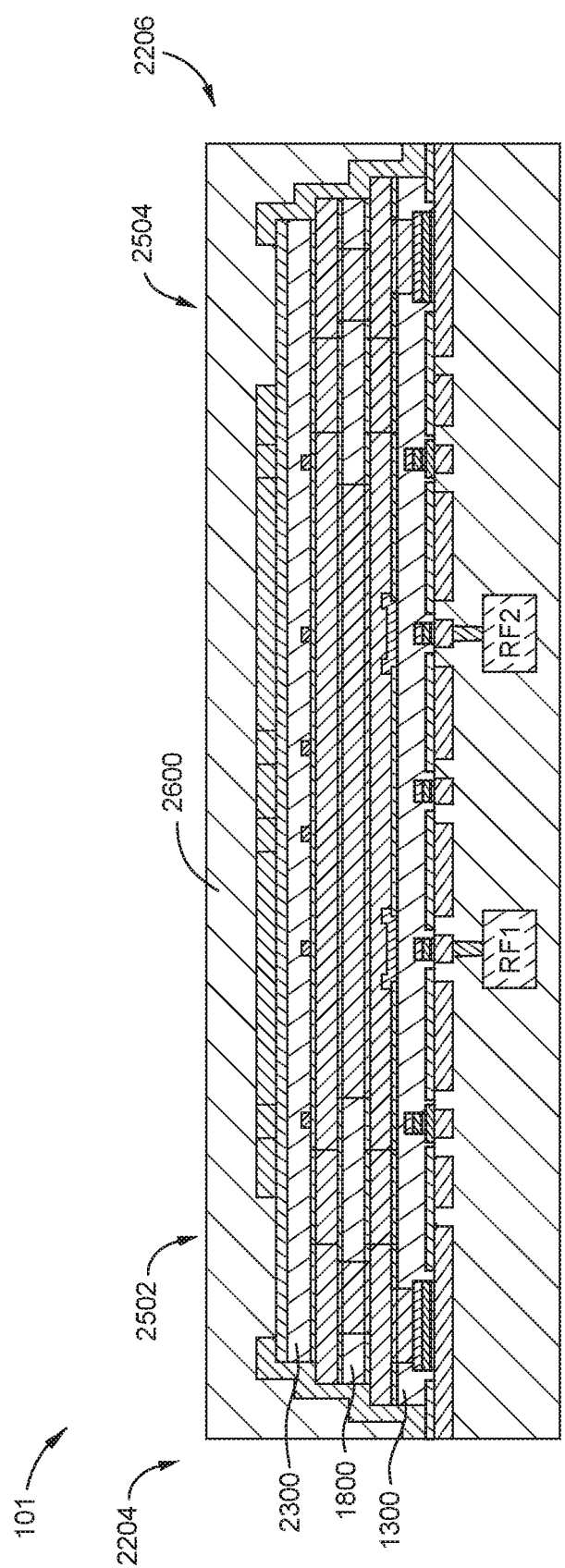
FIG. 26 is a cross-sectional view of the MEMS device of FIG. 25 having a roof dielectric layer deposited thereon in accordance with an example embodiment of the disclosure.

Referring to FIG. 26, a roof dielectric layer 2600 is deposited on the arrangement 101 of FIG. 25. The roof dielectric layer 2600 contacts the partial cavity layer 2500 and portions of the third dielectric layer 2302 exposed through the etched areas 2502, 2504. The roof dielectric layer 2600 is deposited above the partial cavity layer 2500 and on each of the ends 2204, 2206.

Figure 27:
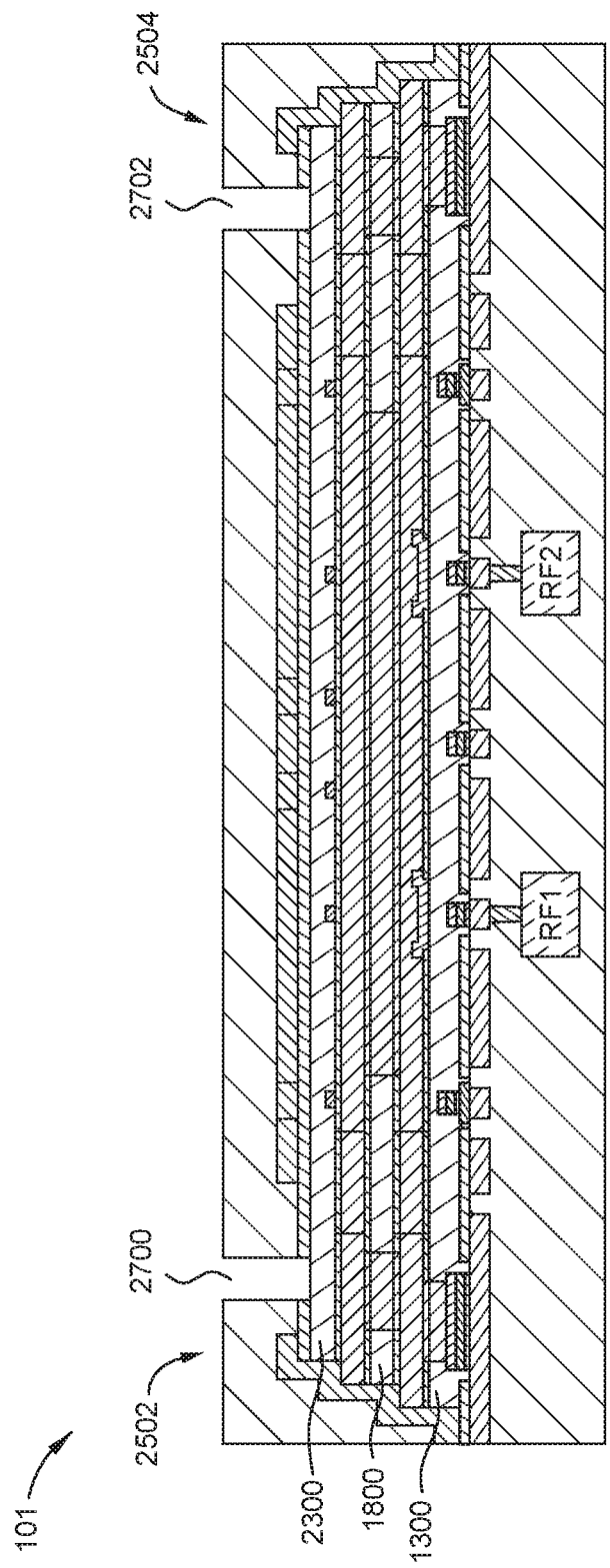
FIG. 27 is a cross-sectional view of the MEMS device of FIG. 26 having release holes etched through the roof dielectric in accordance with an example embodiment of the disclosure.

Referring to FIG. 27, a first release hole 2700 and a second release hole 2702 are etched through portions of the roof dielectric layer 2600 and the third dielectric layer 2302. The release holes 2700, 2702 are disposed above the etched areas 2502, 2504 of the partial cavity layer 2500. The release holes 2700, 2702 are etched through the roof dielectric layer 2600 and a portion of the third dielectric layer 2302 such that the release holes 2700, 2702 extend through to the third spun layer 2300. The release holes 2700, 2702 may be partially disposed above the left end contact 1200 and the right end contact 1202. In a non-limiting embodiment, the etching may be a timed etch.

Figure 28:
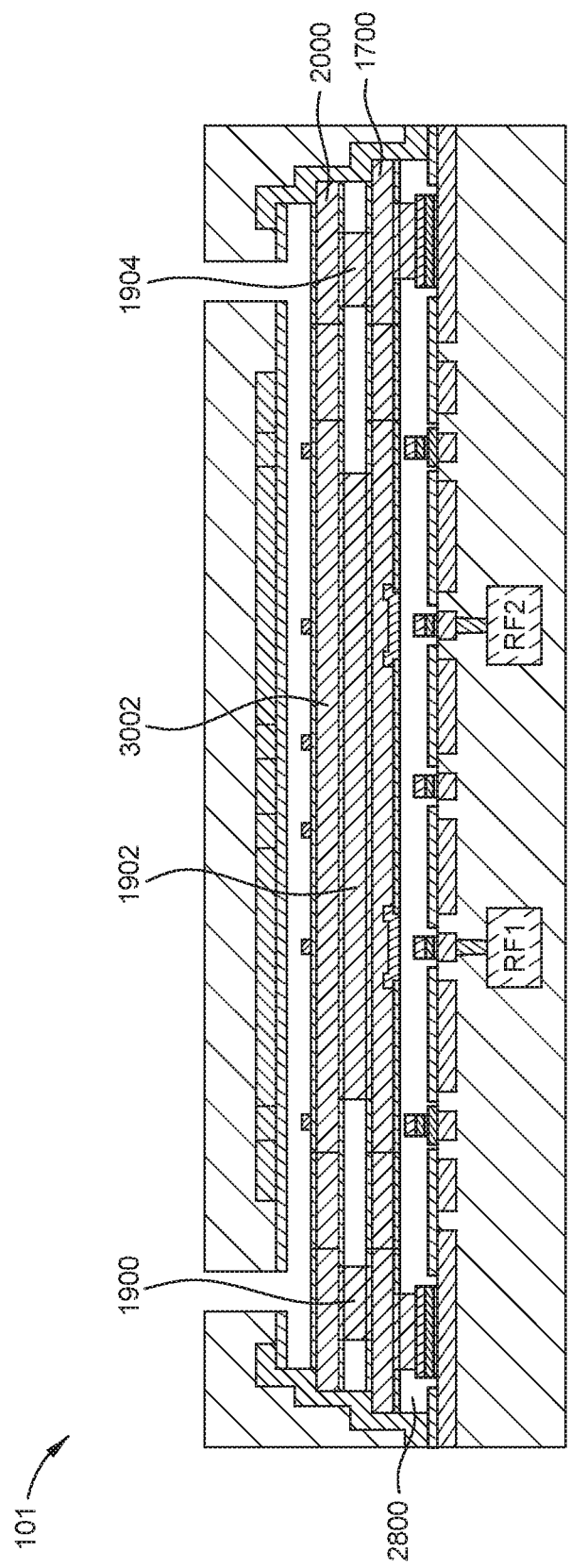
FIG. 28 is a cross-sectional view of the MEMS device of FIG. 27 with a removal of specific layers to produce cavities for the MEMS device in accordance with an example embodiment of the disclosure.

Referring to FIG. 28, the first, second, and third spun layers 1300, 1800, 2300 are removed to produce a cavity 2800 for the arrangement 101. The resulting arrangement 101 provides a beam 3002 comprised of at least the bottom beam layer 1700 and the top beam layer 2000 within the arrangement 101. The bottom beam layer 1700 is coupled to the top beam layer 2000 through the plurality of links 1900, 1902, 1904 created in FIG. 19.

Figure 29:
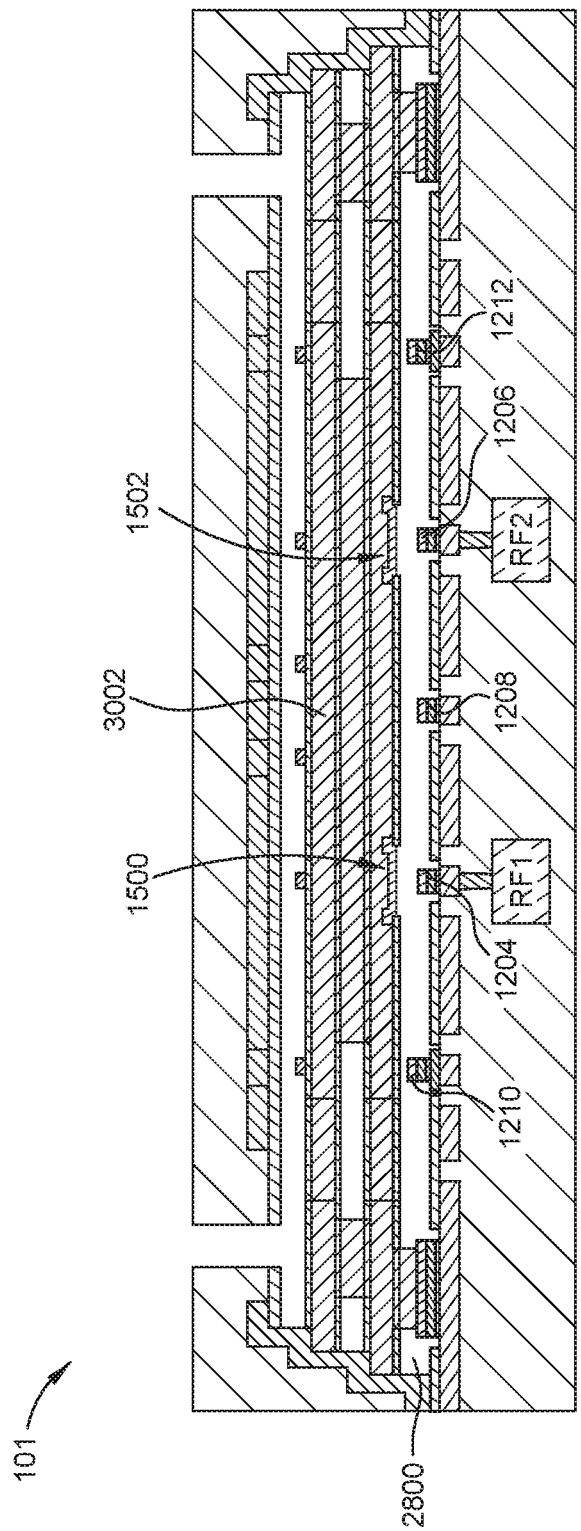
FIG. 29 is a cross-sectional view of the MEMS device of FIG. 28 having partially removal material from the electrical contacts and beam layers in accordance with an example embodiment of the disclosure.

Referring to FIG. 29, a portion of the top Ru layer 1000 of the RF1 contact 1204, RF2 contact 1206, center contact 1208, PB1 contact 1210, and PB2 contact 1212 is partially removed. A bottom portion of the beam contact layers 1500, 1502 disposed above the cavity 2800 is partially removed as well. Etching a portion of the top Ru layer 1000 from each of the contacts 1204-1212 cleans the surface of each of the contacts 1204-1212 that was in contact with the first spun layer 1300. Etching a bottom portion of the beam contact layers 1500, 1502 recesses the beam contact layers 1500, 1502 into the bottom beam layer 1700. Recessing the beam contact layers 1500, 1502 into the bottom beam layer 1700 ensures that the center contact 1208 contacts the beam 3002 prior to either of the RF1 contact 1204 and RF2 contact 1206, as the RF1 contact 1204 and RF2 contact 1206 are now disposed a greater distance from the beam 3002 comprising the beam contact layers 1500, 1502 than the center contact 1208. The partial removal of the top Ru layer 1000 may be executed using a "dry" etch or a plasma etch of a solution containing chlorine. The solution may also include, as a non-limiting embodiment, fluorine.

Figure 30:
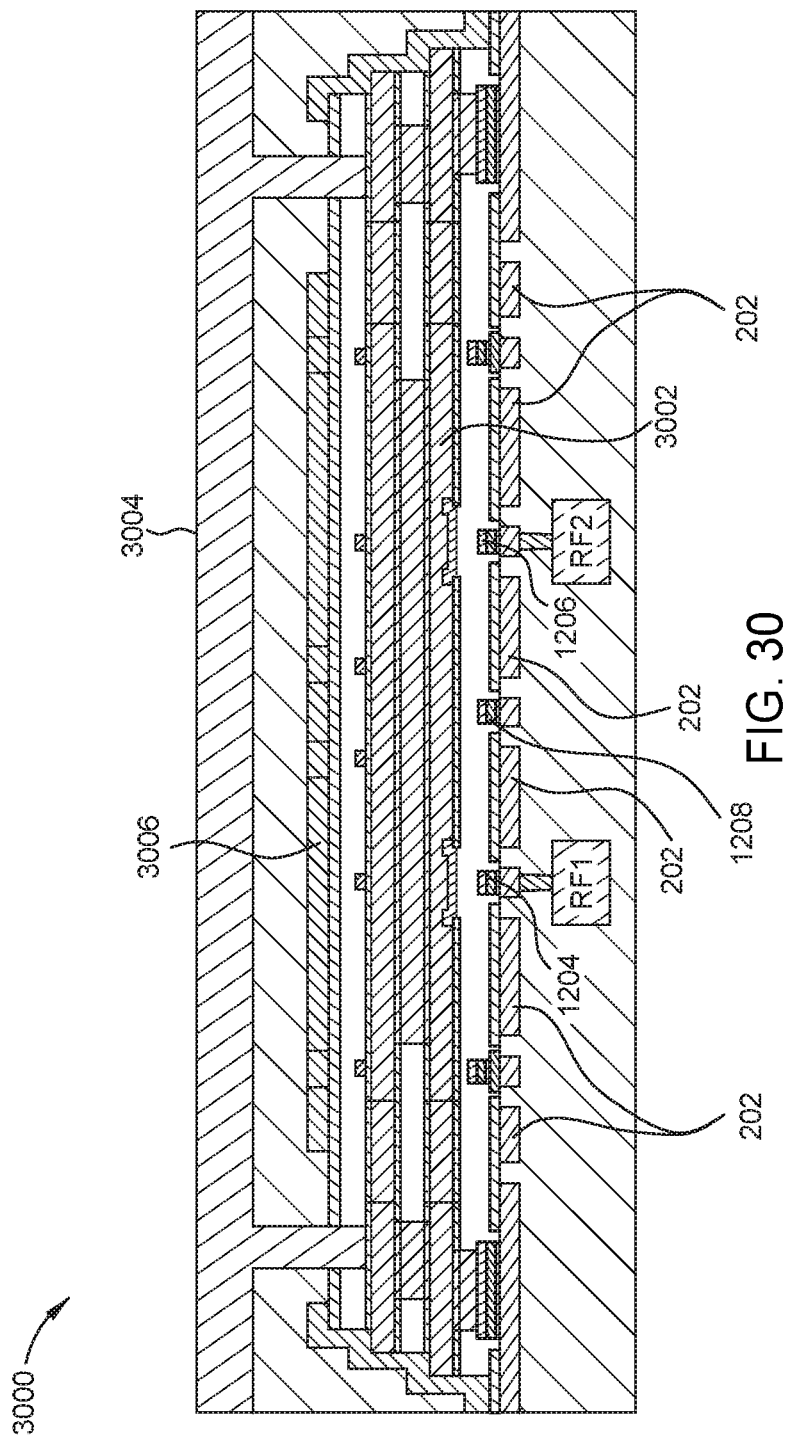
FIG. 30 is a cross-sectional view of the MEMS device of FIG. 29 having a seal layer deposited thereon, completing the overall MEMS device in accordance with an example embodiment of the disclosure.

Referring to FIG. 30, a top seal layer 3004 is deposited to enclose the completed MEMS switch 3000 within the cavity 2800. In the illustrated embodiment, the beam 3002, comprised of at least the bottom beam layer 1700 and the top beam layer 2000, may deflect in an upward direction or a downward direction. As described above, if the beam 3002 deflects in the downward direction, the beam 3002 will contact at least the center contact 1208 prior to contacting either of the RF1 contact 1204 and the RF2 contact 1206. The top electrode 3006 may be used to deflect the beam 3002 in an upwards direction, and the RF1 electrode 106 and RF2 electrode 108 electrodes may be used to deflect the beam 3002 in the downwards direction. As such, the beam 3002 is movable between the top electrode 3006 and the RF1 and RF2 contacts 1204, 1206.

Figure 31:
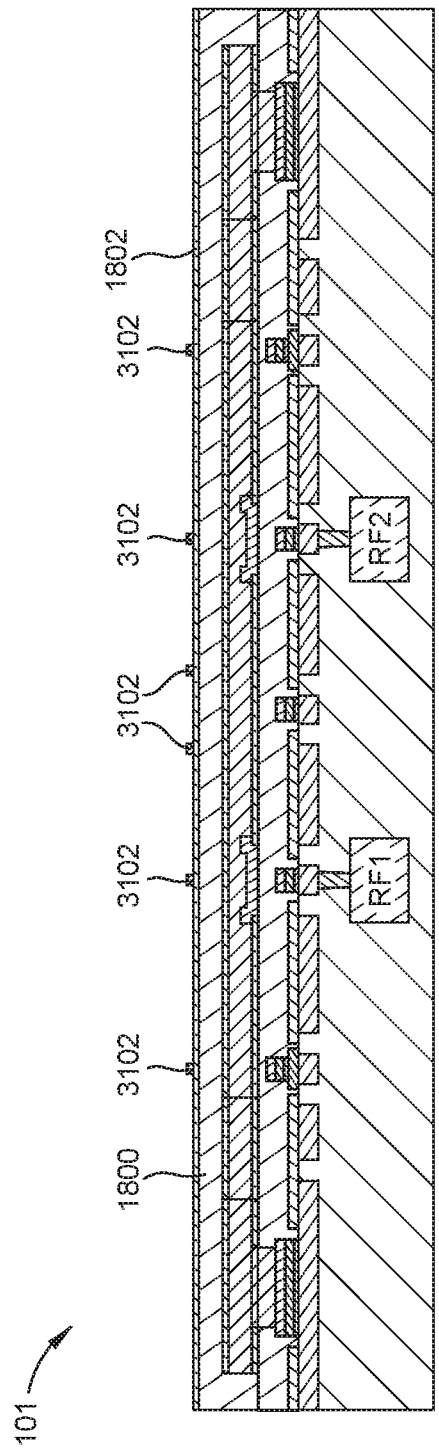

FIGS. 31-35 illustrate an alternative embodiment for forming a plurality of top bumps 3302 on the top beam layer 2000. After the second spun layer 1800 and the second dielectric layer 1802 are deposited in FIG. 18, the method may proceed to FIG. 31, rather than proceeding to FIG. 19. In FIG. 31, a plurality of first bumps 3102 are deposited on the second dielectric layer 1802. The plurality of first bumps 3102 may be deposited as a one layer through chemical vapor deposition, as a non-limiting embodiment, which is then patterned to form the plurality of first bumps 3102.

Figure 32:
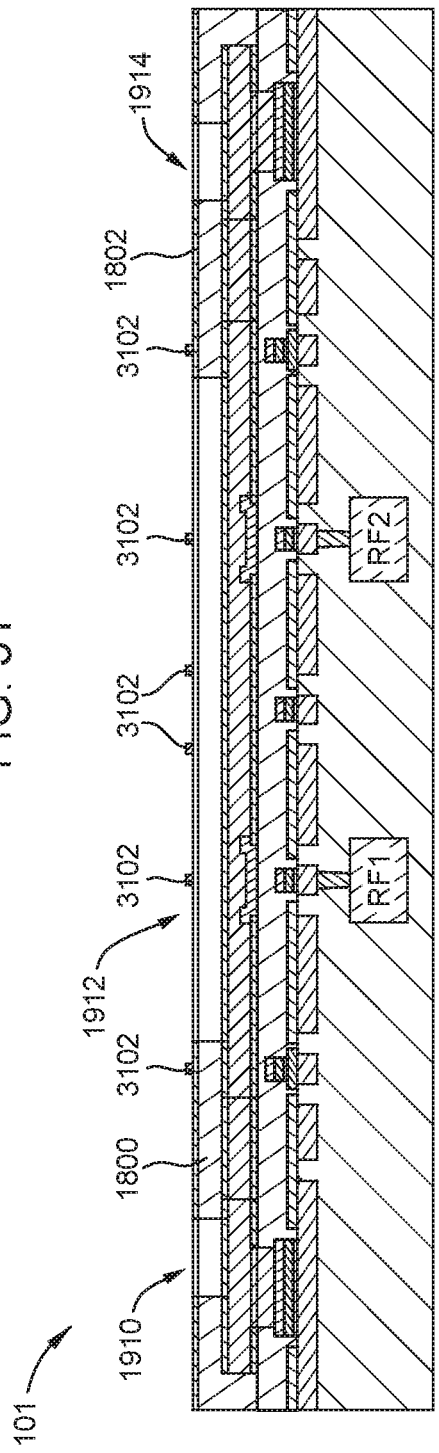

In FIG. 32, portions of the second spun layer 1800 and the second dielectric layer 1802 of the arrangement 101 of FIG. 31 are etched to form a plurality of vias 1910, 1912, 1914 that will form a plurality of links 1900, 1902, 1904 between a bottom beam (i.e., bottom beam layer 1700) and a top beam layer (i.e., top beam layer 2000 shown in FIG. 37).

In FIG. 33, a cross-sectional view of the arrangement 101 of FIG. 32 is illustrated having a deposited top beam layer 2000. A second additional beam layer 2002 may be deposited on the top beam layer 2000. The second additional beam layer 2002 may comprise a dielectric material. The plurality of first bumps 3102 formed in FIG. 31 translate through the top beam layer 2000 and the second additional beam layer 2002 to form a plurality of top bumps 3302 disposed on the top surface 3304 of the top beam layer 2000. The top beam layer 2000 and the second additional beam layer 2002 are also deposited within each of the etched vias 1910, 1912, 1914 in the second spun layer 1800 and on the sidewalls of these etched vias 1910, 1912, 1914, thereby creating the plurality of links 1900, 1902, 1904 between the bottom beam layer 1700 and top beam layer 2000.

In FIG. 34, the top beam layer 2000 is etched at the ends 2204, 2206 of the arrangement 101 to remove a portion of the top beam layer 2000 from each end 2004, 2006, like described in FIG. 22 above. The top beam layer 2000 may be etched to have a shorter length than the bottom beam layer 1700 (i.e., a greater amount of material of the top beam layer 2000 may be removed than is removed from the bottom beam layer 1700). A third leg 2200 and a fourth leg 2202 are then formed in the top beam layer 2000. The third leg 2200 and the fourth leg 2202 may be disposed above or aligned with the first leg 1702 and the second leg 1704.

Figure 35:
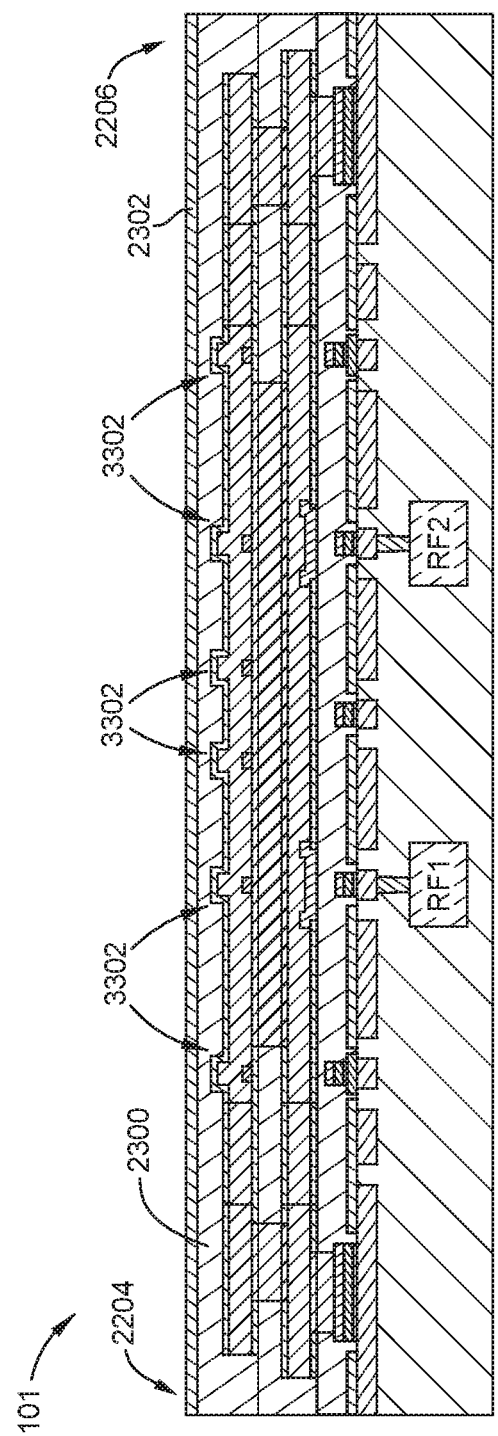

In FIG. 35, a third spun layer 2300 and third dielectric layer 2302 are deposited over the plurality of top bumps 3302 and the top beam layer 2000 of the arrangement 101 of FIG. 34, like described in FIG. 23 above. The third spun layer 2300 may be a sacrificial layer. The third dielectric layer 2302 may be a silicon dioxide layer. The third spun layer 2300 may comprise the same materials as the first spun layer 1300 and/or the second spun layer 1800, and the third dielectric layer 2302 may comprise the same material as the first dielectric layer 1302 and/or the second dielectric layer 1802. The third dielectric layer 2302 may have a greater thickness than the first dielectric layer 1302 and/or the second dielectric layer 1802. The third spun layer 2300 is deposited over each end 2004, 2006 such that portions of the third spun layer 2300 contact portions of the second spun layer 1800.

Follow FIG. 35, the method proceeds to FIG. 24 above. Thus, FIGS. 19-23 illustrate a first embodiment for forming a plurality of bumps 2100 on the top beam layer 2000, and FIGS. 31-35 illustrate a second, alternative embodiment for forming a plurality of top bumps 3302 on the top beam layer 2000. While six top bumps 3302 are shown in FIGS. 31-35, any number of top bumps 3302 may be included, and the number of top bumps 3302 shown is not intended to be limiting. Additionally, while one row of top bumps 3302 is shown in FIGS. 31-35, additional rows of top bumps 3302 may be included. The plurality of top bumps 3302 may be used to contact the third dielectric layer 2302 disposed above the top beam layer 2000 to prevent the top beam layer 2000 from directly contacting or colliding with the third dielectric layer 2302.

Using the above described method to form a MEMS device or switch results in a MEMS device having increased flexibility, and allows a beam of the MEMS device to be fully supported before contacting the RF electrodes. By forming at least two electrical contacts having a greater height than the RF contacts, the beam of the MEMS device is prevented from contacting the RF contacts with a great amount of force. Additionally, when forming the electrical contacts, using each previously deposited and etched layer as an etch stop for the layer disposed on top allows each layer to be uniformly deposited and further allows the electrical contact formation process to be highly controlled. As such, the overall uniformity of the electrical contacts is increased, and the various heights of the electrical contacts are accurately controlled. Furthermore, by including one or more hinge sections in the beam of the MEMS device, portions of the beam may move independently from one another to further ensure the RF contacts are contacted last with a small amount of force.

As will be understood, in instances described above as an "etch", different types of etching may occur, as applicable. In some embodiments, either a "wet" etch or a "dry" etch may be performed. Etching and other process steps may include variations of the temperature under which the materials are exposed. In some embodiments, for example, an elevation in temperature may increase the amount of deposition of material. Deposition steps may be accomplished through chemical vapor deposition or physical vapor deposition as non-limiting embodiments. In method steps related to spin or spun on products, it will be understood that such products may come from doped solutions, as a non-limiting embodiment.

In the embodiments disclosed above, a method for making a microelectromechanical device is disclosed. The devices may be used in many types of application, such as in wireless communications as well as consumer products. The device manufacturing methods have a small footprint and as such, the methods and apparatus provide advantages over conventional electrical arrangements. The resulting microelectromechanical devices can be small rendering their use in a variety of products.

The method provided allows for production/manufacture of microelectromechanical devices such that the production has a high yield and low defect rate. As the resulting microelectromechanical devices are small in scale, the amount of power needed for switching purposes is minimal, providing power saving advantages for products that use such devices. The methods themselves are highly and reliably repeatable thereby allowing for a high quality factor of devices production. Additionally, the methods provided can be performed in "batch" form, thereby allowing a multitude of devices to be made simultaneously.

The method used to produce the MEMS devices and the design of the MEMS devices itself prevent failure modes of conventional MEMS devices by limiting unwanted beam contact in areas of the switch that are not intended.

In one embodiment, a microelectromechanical device comprises a backplane comprising at least two electrodes, a first layer disposed on the backplane, a top electrode disposed above and spaced from the first layer, a beam disposed between the first layer and the top electrode, the beam moveable between the at least two electrodes and the top electrode, and one or more electrical contacts disposed over the first layer and spaced from the beam, the one or more electrical contacts comprising a first ruthenium layer disposed on the first layer, a titanium nitride layer disposed on the first ruthenium layer, and a second ruthenium layer disposed on the titanium nitride layer.

The one or more electrical contacts, the beam, and the top electrode may be enclosed in a sealed cavity. The beam may comprise a bottom beam layer and a top beam layer coupled together by a plurality of links. The beam may comprise one or more beam contact layers disposed above the one or more electrical contacts. The microelectromechanical device may further comprise a first dielectric layer disposed over the first layer. The one or more electrical contacts may comprise a first electrical contact and a second electrical contact disposed on the first dielectric layer. The one or more electrical contacts may further comprise a third electrical contact and a fourth electrical contact disposed on the first layer. The first electrical contact and the second electrical contact may be aligned with the one or more beam contact layers, and the third electrical contact and the fourth electrical contact may be aligned with the at least two electrodes.

In another embodiment, a method of forming a microelectromechanical device comprises depositing and patterning a first layer on a backplane comprising at least two electrodes and forming one or more electrical contacts over the first layer. Forming the one or more electrical contacts comprises depositing a first ruthenium layer over the first layer, depositing a titanium nitride layer over the first ruthenium layer, depositing a second ruthenium layer over the titanium nitride layer, etching the second ruthenium layer with a first etchant, etching the titanium nitride layer with a second etchant different than the first etchant, and etching the first ruthenium layer with the first etchant. The method of forming the microelectromechanical device further comprises forming a beam above one or more electrical contacts, the beam being spaced from the one or more electrical contacts, forming a top electrode above the beam, and depositing a seal layer above the beam to enclose the beam in a cavity.

The first layer may comprise an oxide material. The first etchant may have a high etch selectivity for ruthenium compared to titanium nitride and oxide materials. The second etchant may have a high etch selectivity for titanium nitride compared to ruthenium. Forming the beam may comprise depositing a first spun layer over the one or more electrical contacts, depositing a second dielectric layer over the first spun layer, etching one or more areas of the second dielectric layer, depositing one or more beam contact layers in the one or more etched areas, and depositing a bottom beam layer over the second dielectric layer and the one or more beam contact layers. Forming the beam may further comprise depositing a second spun layer on the bottom beam layer, forming a plurality of links in the second spun layer, and depositing a top beam layer on the second spun layer. Forming the beam may further comprise depositing a third spun layer over the top beam layer and removing the first spun layer, the second spun layer, and the third spun layer.

The method may further comprise depositing a first dielectric layer over the first layer. The one or more electrical contacts may comprise a first electrical contact and a second electrical contact disposed on the first dielectric layer. The first electrical contact and the second electrical contact may be aligned with the one or more beam contact layers. The one or more electrical contacts may further comprise a third electrical contact and a fourth electrical contact aligned with the at least two electrodes.

Those skilled in the art will recognize improvements and modifications to the preferred embodiments of the present disclosure. All such improvements and modifications are considered within the scope of the concepts disclosed herein and the claims that follow.

What is claimed is:

1. A microelectromechanical device, comprising:
   a backplane comprising at least two electrodes;
   a first layer disposed on the backplane, the first layer comprising at least one first portion and at least two second portions spaced from each other and from the at least one first portion, each second portion aligned with a respective electrode;
   a base layer comprising at least one base layer portion, each base layer portion disposed over a respective first portion of the first layer;
   a top electrode disposed above and spaced from the first layer;
   a beam disposed between the first layer and the top electrode, the beam moveable between the at least two electrodes and the top electrode;
   two or more first electrical contacts, each first electrical contact disposed over a respective second portion of the first layer and spaced from the beam when the microelectromechanical device is not in an on state; and
   one or more second electrical contacts, each second electrical contact disposed over a respective base layer portion and spaced from the beam when the microelectromechanical device is not in the on state.

2. The microelectromechanical device of claim 1, wherein the two or more first electrical contacts, the one or more second electrical contacts, the beam, and the top electrode are enclosed in a sealed cavity.

3. The microelectromechanical device of claim 1, wherein the beam comprises two or more beam contact layers disposed above the two or more first electrical contacts.

4. The microelectromechanical device of claim 3, wherein:
   the at least one first portion of the first layer comprises a third portion of the first layer and a fourth portion of the first layer;
   the at least one base layer portion comprises a first base layer portion disposed on the third portion of the first layer and a second base layer portion disposed on the fourth portion of the first layer;
   the at least two second portions of the first layer comprises a fifth portion of the first layer and a sixth portion of the first layer;
   the one or more second electrical contacts comprise a third electrical contact disposed on the first base layer portion and a fourth electrical contact disposed on the second base layer portion; and
   the two or more first electrical contacts further comprise a fifth electrical contact disposed on the fifth portion of the first layer and a sixth electrical contact disposed on the sixth portion of the first layer.

5. The microelectromechanical device of claim 4, wherein:
   the at least two electrodes comprise a first electrode and a second electrode;
   the one or more beam contact layers comprise a first beam contact layer and a second beam contact layer; and
   the fifth electrical contact is aligned with the first beam contact layer and the sixth electrical contact is aligned with the second beam contact layer.

6. The microelectromechanical device of claim 5, wherein a first via connects the first electrode to the fifth portion of the first layer and a second via connects the second electrode to the sixth portion of the first layer.

7. The microelectromechanical device of claim 1, wherein:
   the beam comprises two or more beam contact layers disposed above the two or more first electrical contacts; and
   the two or more beam contact layers are recessed into a bottom surface of the beam.

8. The microelectromechanical device of claim 1, wherein the two or more first electrical contacts and the one or more second electrical contacts each comprise a first ruthenium layer disposed on the first layer, a titanium nitride layer disposed on the first ruthenium layer, and a second ruthenium layer disposed on the titanium nitride layer.

9. The microelectromechanical device of claim 1, wherein:
the one or more bumps form a first row of bumps over the top surface of the beam; and
the microelectromechanical device further comprises a dielectric layer disposed over the first row of bumps, wherein:
the second dielectric layer forms a second row of one or more bumps over the first row of bumps; and
each bump in the second row of one or more bumps is aligned with a corresponding bump in the first row of bumps.

10. The microelectromechanical device of claim 1, further comprising:
a dielectric layer disposed under the top electrode and above and spaced from a top surface of the beam;
a roof dielectric layer disposed over the top electrode; and
a seal layer disposed over the roof dielectric layer and portions of the dielectric layer, wherein the seal layer extends toward the top surface of the beam through one or more release holes formed in the roof dielectric layer and in the dielectric layer.

11. The microelectromechanical device of claim 1, further comprising one or more bumps disposed over a top surface of the beam.

12. The microelectromechanical device of claim 11, wherein:
the beam comprises a bottom beam layer and a top beam layer coupled together by a plurality of links; and
the top surface of the beam is a top surface of the top beam layer.

13. The microelectromechanical device of claim 1, further comprising a dielectric layer disposed over the first layer, the dielectric layer comprising dielectric portions, wherein each of the one or more base layer portions is between respective dielectric portions.

14. The microelectromechanical device of claim 1, wherein:
the two or more first electrical contacts have a first height; and
the one or more second electrical contacts and the respective base layer portions have a second height that is greater than the first height.

15. A microelectromechanical device, comprising:
a backplane comprising an electrode;
a first layer disposed on the backplane, the first layer comprising:
a plurality of first portions spaced from each other;
a plurality of second portions spaced from each other and from each first portion in the plurality of the portions, a respective second portion in the plurality of second portions of the first layer aligned with the electrode and connected to the electrode through a via;
a base layer, the base layer comprising a base layer portion over a respective first portion in the plurality of first portions of the first layer;
a top electrode above and spaced from the backplane;
a beam between the top electrode and the backplane, the beam moveable between the top electrode and the electrode;
a first electrical contact over the base layer portion and spaced from the beam when the microelectromechanical device is not in an on state;
a second electrical contact over the respective second portion in the plurality of second portions of the first layer and spaced from the beam when the microelectromechanical device is not in the on state.

16. The microelectromechanical device of claim 15, wherein the first electrical contact and the second electrical contact each comprise a ruthenium layer.

17. The microelectromechanical device of claim 15, further comprising a dielectric layer disposed over the first layer, the dielectric layer comprising dielectric portions, wherein the base layer portion is between respective dielectric portions.

18. The microelectromechanical device of claim 15, wherein:
the electrode is a first electrode;
the via is a first via;
the backplane further comprises a second electrode;
the respective first portion of the first layer is a third portion;
the plurality of first portions further comprises a fourth portion;
the base layer portion is a first base layer portion;
the base layer further comprises a second base layer portion over the fourth portion of the first layer;
the respective second portion of the first layer is a fifth portion;
the plurality of second portions further comprises a sixth portion aligned with the second electrode and connected to the second electrode through a second via; and
the microelectromechanical device further comprises:
a third electrical contact over the second base layer portion; and
a fourth electrical contact over the sixth portion of the first layer.

19. The microelectromechanical device of claim 18, wherein:
the first electrical contact and the first base layer portion have a first height;
the third electrical contact and the second base layer portion have the first height;
the second electrical contact and the fourth electrical contact each have a second height that is less than the first height; and
the second electrical contact and the fourth electrical contact are between the first electrical contact and the third electrical contact.

20. The microelectromechanical device of claim 19, wherein:
the plurality of first portions further comprises a seventh portion; and
the microelectromechanical device further comprises a fifth electrical contact over the seventh portion, the fifth electrical contact having the first height and positioned between the second electrical contact and the fourth electrical contact.

* * * * *